(12) United States Patent
Fukumoto et al.

(10) Patent No.: US 7,927,096 B2
(45) Date of Patent: Apr. 19, 2011

(54) SUBSTRATE SUPPORT STRUCTURE, HEAT TREATMENT APPARATUS USING SAME, FIRST SHEET-LIKE OBJECT FOR USE IN THE SUBSTRATE SUPPORT STRUCTURE, METHOD OF MANUFACTURING THE SUBSTRATE SUPPORT STRUCTURE, HEAT TREATMENT APPARATUS, AND SUBSTRATE SUCKING METHOD

(75) Inventors: Yasuhiro Fukumoto, Kyoto (JP); Masao Tsuji, Kyoto (JP); Hiroshi Miyauchi, Kyoto (JP); Hideyuki Taniguchi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 833 days.

(21) Appl. No.: 11/688,006

(22) Filed: Mar. 19, 2007

(65) Prior Publication Data
US 2007/0222131 A1    Sep. 27, 2007

(30) Foreign Application Priority Data

Mar. 23, 2006  (JP) .................. 2006-080863
Mar. 23, 2006  (JP) .................. 2006-080864
Mar. 23, 2006  (JP) .................. 2006-080865

(51) Int. Cl.
  *F27D 5/00*    (2006.01)
(52) U.S. Cl. ............... 432/253; 432/259; 219/444.1
(58) Field of Classification Search ............. 432/242, 432/247, 253, 259; 219/443.1, 444.1
See application file for complete search history.

(56) References Cited

U.S. PATENT DOCUMENTS

| | | | | |
|---|---|---|---|---|
| 5,588,827 | A * | 12/1996 | Muka | 432/5 |
| 6,129,546 | A * | 10/2000 | Sada | 432/253 |
| 6,394,797 | B1 * | 5/2002 | Sugaya et al. | 432/253 |
| 6,416,318 | B1 * | 7/2002 | Lee et al. | 432/247 |
| 6,518,548 | B2 * | 2/2003 | Sugaya et al. | 219/444.1 |
| 6,960,743 | B2 * | 11/2005 | Hiramatsu et al. | 219/444.1 |
| 7,432,476 | B2 * | 10/2008 | Morita et al. | 219/444.1 |
| 2002/0025656 | A1 | 2/2002 | Arai et al. | |
| 2003/0168439 | A1 * | 9/2003 | Kanno et al. | 219/390 |
| 2003/0186183 | A1 * | 10/2003 | Ito et al. | 432/253 |
| 2004/0217105 | A1 * | 11/2004 | Ito et al. | 219/444.1 |
| 2006/0191482 | A1 * | 8/2006 | Kanno et al. | 118/725 |
| 2006/0289432 | A1 | 12/2006 | Morita et al. | |

FOREIGN PATENT DOCUMENTS

CN    1591816    3/2005
(Continued)

OTHER PUBLICATIONS

U.S. Appl. No. 11/566,442, filed Dec. 4, 2006.
(Continued)

*Primary Examiner* — Gregory A Wilson
(74) *Attorney, Agent, or Firm* — Ostrolenk Faber LLP

(57) ABSTRACT

A heat treatment apparatus includes a support sheet placed on an upper surface of a heat-treating plate. The support sheet has, formed on an upper surface thereof, projections for contacting and supporting a substrate, and a lip for contacting edge regions of the substrate. The support sheet is formed by an etching process, and therefore areas of the sheet around the projections are recessed, rather than being perforated as in the case of laser processing. These heat-treating plate and support sheet constitute a substrate support structure capable of supporting the substrate properly.

19 Claims, 22 Drawing Sheets

FOREIGN PATENT DOCUMENTS

| | | |
|---|---|---|
| JP | 7-169367 | 7/1995 |
| JP | 9-246363 | 9/1997 |
| JP | 10-116887 | 5/1998 |
| JP | 10-284360 | 10/1998 |
| JP | 2002-76096 | 3/2002 |
| JP | 2003-152060 | 5/2003 |
| JP | 2004-172463 | 6/2004 |
| JP | 2005-85881 | 3/2005 |
| JP | 2006-319093 | 11/2006 |

OTHER PUBLICATIONS

Japanese Patent Application No. 2005-353432, filed Dec. 7, 2005, corresponds to U.S. Patent Application listed above.

* cited by examiner

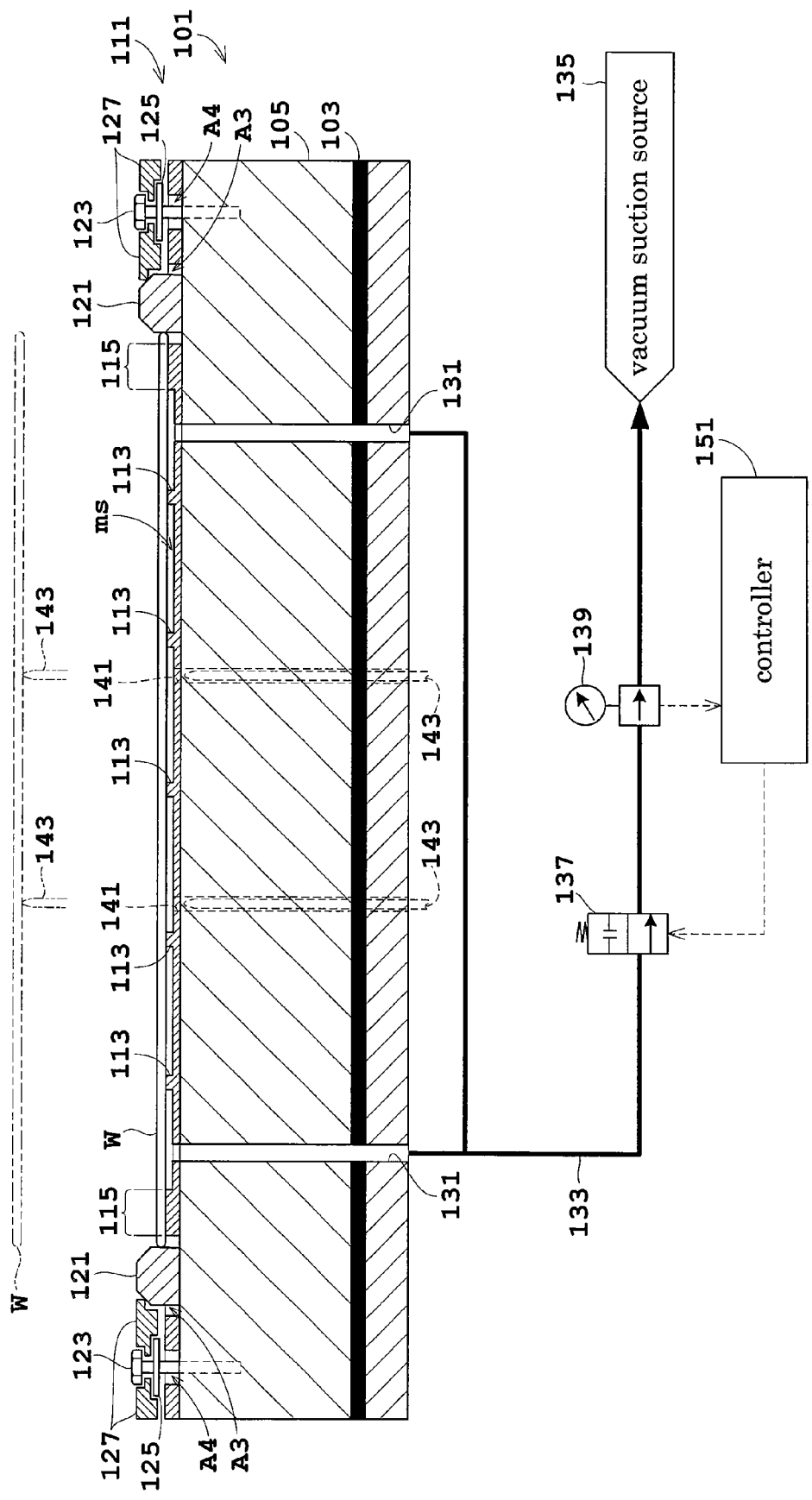

SUBSTRATE SUPPORT STRUCTURE, HEAT TREATMENT APPARATUS USING SAME, FIRST SHEET-LIKE OBJECT FOR USE IN THE SUBSTRATE SUPPORT STRUCTURE, METHOD OF MANUFACTURING THE SUBSTRATE SUPPORT STRUCTURE, HEAT TREATMENT APPARATUS, AND SUBSTRATE SUCKING METHOD

BACKGROUND OF THE INVENTION (1) Field of the Invention

This invention relates to a substrate support structure for supporting substrates such as semiconductor wafers, glass substrates for liquid crystal displays, glass substrates for photomasks and substrates for optical disks (hereinafter simply called "substrates"), a first sheet-like object for use in the substrate support structure, a method of manufacturing the substrate support structure, a heat treatment apparatus for heat-treating the substrates, and a substrate sucking method for sucking the substrates.

(2) Description of the Related Art

As requirements for fine line width and line width uniformity of patterns formed on substrates have become increasingly stringent in recent years, a strong demand is being placed for temperature uniformity in baking treatment in photolithography, especially in baking treatment after exposure (PEB: Post Exposure Bake).

Thus, a heat treatment apparatus has been proposed that heat-treats substrates supported by suction (as disclosed in Japanese Unexamined Patent Publication H10-284360 (1998), for example). This heat treatment apparatus has metallic projections formed on the upper surface of a heat-treating plate and coated with resin. These projections constitute a substrate support structure for contacting and supporting each substrate. The heat-treating plate has a ring-like sealer disposed on the upper surface thereof for contacting edge regions of the substrate. Further, exhaust bores are formed to extend through the upper and lower surfaces of the heat-treating plate for exhausting gas. When a substrate is placed on the substrate support structure, a closed space is formed between the substrate and heat-treating plate. Gas is exhausted from this space through the exhaust bores, thereby to apply suction to the substrate. By sucking the substrate in this way, any curvature of the substrate is corrected to heat the substrate uniformly.

The conventional apparatus noted above has the following drawback.

Since the projections that contact the substrate are metal as is the heat-treating plate, heat is transferred mainly through the projections to the substrate supported by the substrate support structure. This results in an inconvenience of a great difference in heat history over the substrate surface occurring between areas in contact with the projections and other areas.

SUMMARY OF THE INVENTION

This invention has been made having regard to the state of the art noted above, and its objects are (I) to provide a substrate support structure for supporting substrates in an advantageous way, a heat treatment apparatus using this support structure, a first sheet-like object for use in the substrate support structure, and a method of manufacturing the substrate support structure, (II) to provide a heat treatment apparatus for heat-treating substrates effectively, and (III) to provide a heat treatment apparatus and a substrate sucking method capable of sucking substrates effectively.

The above object (I) is fulfilled, according to this invention, by a substrate support structure for supporting a substrate, comprising a plate body for supporting the substrate; and a first sheet-like object formed of resin and placed on an upper surface of the plate body, the first sheet-like object having projections formed on a front surface thereof for contacting and supporting the substrate; wherein the projections of the first sheet-like object are formed by an etching process.

According to this invention, areas around the projections formed by the etching process do not constitute perforations. The substrate support structure with such first sheet-like object placed on the plate body can support the substrate reliably. A difference in heat transfer rate occurring over the substrate surface between contact parts in contact with the projections and non-contact parts out of contact with the projections can be reduced, thereby to inhibit variations in heat history over the substrate surface.

As used herein, the "projections" include parts elevated in the shape of points in plan view, and parts elevated in the shape of continuous lines (straight or curved) in plan view.

In the invention noted above, the first sheet-like object may have a flat back surface. Then, the substrate support structure is constructed of the first sheet-like object properly placed on the plate body.

The first sheet-like object may have a ring-like lip for contacting edge regions of the substrate, the lip being formed by the etching process. The lip can close lateral areas of a space formed between the substrate and the first sheet-like object.

The first sheet-like object may have first openings for sucking gas from a space formed between the substrate and the first sheet-like object. Then, the substrate placed on the substrate support structure is suction-supported effectively.

In another aspect of the invention, a heat treatment apparatus for heat-treating a substrate comprises a substrate support structure as noted above; and a heating device for heating the substrate.

This apparatus can perform reliable heat treatment of the substrate.

In a further aspect, the invention provides a first sheet-like object used in a substrate support structure having the first sheet-like object formed of resin and placed on an upper surface of a plate body for supporting a substrate, the first sheet-like object comprising projections formed on a front surface of the first sheet-like object by an etching process, for contacting and supporting the substrate.

Thus, the invention realizes a substrate support structure appropriately.

In a still further aspect of the invention, a method of manufacturing a substrate support structure for supporting a substrate is provided which comprises forming, by an etching process, projections on one surface of a first sheet-like object formed of resin, for contacting and supporting the substrate; and placing, on a plate body, the first sheet-like object having the projections formed thereon, with the projections facing up.

In this way, the invention provides an appropriate method of manufacturing the substrate support structure.

The object (II) is fulfilled, according to this invention, by a heat treatment apparatus for heat-treating a substrate, comprising a heat-treating plate; a second sheet-like object placed on the heat-treating plate, the second sheet-like object having, formed on a surface thereof, a ring-like sealer for contacting edge regions of the substrate, and projections for contacting and supporting the substrate inwardly of the sealer; and first exhaust bores for exhausting gas from a space formed between the substrate and the second sheet-like object.

According to this invention, the second sheet-like object is placed on the heat-treating plate, and expansion and contraction, if any, of the second sheet-like object take place with no obstruction. This prevents creases and the like occurring with the second sheet-like object.

In the invention noted above, the second sheet-like object may have third openings formed outwardly of the sealer; the apparatus may further comprise insert elements arranged in the third openings; and the third openings and the insert elements may have gaps therebetween for permitting expansion and contraction of the second sheet-like object. With the gaps formed between the third openings and insert elements, the insert elements present no obstruction to the expansion and contraction of the second sheet-like object.

The apparatus may further comprise a lift restrictor disposed above and outwardly of the sealer and spaced from the second sheet-like object for restricting lifting of the second sheet-like object from the heat-treating plate. The lift restrictor can appropriately restrict lifting of the second sheet-like object from the heat-treating plate.

The apparatus may further comprise guide elements for horizontally positioning the substrate; and a positioning member for contacting and positioning the guide elements; wherein the guide elements are arranged in the third openings to act also as the insert elements, and the positioning member acts also as the lift restrictor. The invention realizes a simplified construction with the guide elements acting also as the insert elements, and the positioning member acting also as the lift restrictor.

The apparatus may further comprise guide elements for horizontally positioning the substrate, the guide elements being arranged in the third openings to act also as the insert elements. The construction is simplified with the guide elements acting also as the insert elements.

The apparatus may further comprise weights arranged on the second sheet-like object outwardly of the sealer for permitting expansion and contraction of the second sheet-like object. With this construction, the expansion and contraction of the second sheet-like object are not obstructed by the weights.

The apparatus may further comprise a lift restrictor disposed above and outwardly of the sealer and spaced from the second sheet-like object for restricting lifting of the second sheet-like object from the heat-treating plate. The lift restrictor can appropriately restrict lifting of the second sheet-like object from the heat-treating plate.

The apparatus may further comprise guide elements for horizontally positioning the substrate; and a positioning member for contacting and positioning the guide elements; wherein the guide elements are arranged on the second sheet-like object outwardly of the sealer to act also as the weights, and the positioning member acts also as the lift restrictor. The invention realizes a simplified construction with the guide elements acting also as the weights, and the positioning member acting also as the lift restrictor.

The apparatus may further comprise guide elements for horizontally positioning the substrate, the guide elements being arranged on the second sheet-like object outwardly of the sealer to act also as the weights. The construction is simplified with the guide elements acting also as the weights.

The apparatus may further comprise a lift restrictor disposed above and outwardly of the sealer and spaced from the second sheet-like object for restricting lifting of the second sheet-like object from the heat-treating plate. The lift restrictor can appropriately restrict lifting of the second sheet-like object from the heat-treating plate.

The object (III) is fulfilled, according to this invention, by a heat treatment apparatus for heat-treating a substrate, comprising a heat-treating plate; a second sheet-like object placed on an upper surface of the heat-treating plate, the second sheet-like object having projections formed thereon for contacting and supporting the substrate; a closing device for closing areas laterally of a space formed between the substrate and the second sheet-like object; second exhaust bores for exhausting gas from the space; and suction bores formed in the heat-treating plate for sucking the second sheet-like object.

According to this invention, the suction bores formed in the heat-treating plate for sucking the second sheet-like object can effectively bring the second sheet-like object into tight contact with the heat-treating plate. Consequently, the substrate is sucked while inhibiting movement of the second sheet-like object relative to the heat-treating plate.

The above apparatus may further comprise grooves formed in the upper surface of the heat-treating plate to communicate with the suction bores. Then, the second sheet-like object is sucked to the grooves, whereby the second sheet-like object comes into tight contact with the heat-treating plate effectively.

Alternatively, the apparatus may further comprise grooves formed in the upper surface of the heat-treating plate to communicate with the second exhaust bores, the second exhaust bores acting also as the suction bores. With the second exhaust bores acting also as the suction bores, the apparatus does not require suction bores exclusively for sucking the second sheet-like object, and thus has a simplified construction.

The grooves may have a height from bottoms thereof to the upper surface of the heat-treating plate, which is larger than a height of the projections. Then, when sucking the substrate, the pressure in the grooves is made lower than the pressure in the space formed between the substrate and the second sheet-like object. This pressure difference results in a force acting on the second sheet-like object in the direction of the heat-treating plate to bring the second sheet-like object into tight contact with the heat-treating plate.

The grooves may extend between edge regions and a center of the heat-treating plate. Then, the second sheet-like object is sucked as a whole.

The second exhaust bores may include plate bores formed in the heat-treating plate, and sheet bores formed in the second sheet-like object to communicate with the plate bores, the sheet bores being arranged adjacent edge regions of the heat-treating plate. Then, even when ambient air flows in from areas laterally of the space formed between the substrate and the second sheet-like object, the second exhaust bores formed in the edge regions can immediately exhaust such ambient air. Thus, ambient air is prevented from flowing toward the center of the heat-treating plate.

In a further aspect of the invention, a substrate sucking method is provided for sucking a substrate contacted and supported by projections formed on a second sheet-like object placed on an upper surface of a heat-treating plate, the method comprising forming a first space between the substrate and the second sheet-like object; forming a second space between the second sheet-like object and the heat-treating plate; and exhausting gases from the first space and the second space while maintaining a pressure in the second space below a pressure in the first space.

With the method according to this invention, the relationship between the pressures in the first and second spaces occurring in time of gas exhaustion can produce a force acting on the second sheet-like object in the direction of the heat-treating plate, but not a force in the direction of the substrate. Thus, the substrate is sucked while inhibiting movement of the second sheet-like object relative to the heat-treating plate.

In the above method, in time of gas exhaustion, a flow resistance to gas flows occurring in the second space may be lower than a flow resistance in the first space. This makes the pressure in the second space lower than that in the first space. Consequently, the second sheet-like object is placed in tight contact with the heat-treating plate.

This specification discloses the following features of the heat treatment apparatus as well:

(1) An apparatus comprising grooves formed in the upper surface of the heat-treating plate to communicate with the suction bores, wherein said grooves are linear.

(2) An apparatus comprising grooves formed in the upper surface of the heat-treating plate to communicate with the second exhaust bores, the second exhaust bores acting also as the suction bores, wherein said grooves are linear.

According to this feature of the invention, the grooves can be reduced in length. This inhibits generation of particles due to the grooves and the influence of the grooves on the quality of heat treatment. Moreover, the straight grooves can be formed easily.

(3) An apparatus comprising grooves formed in the upper surface of the heat-treating plate to communicate with the suction bores, wherein said grooves are formed independently for each of said suction bores.

(4) An apparatus comprising grooves formed in the upper surface of the heat-treating plate to communicate with the second exhaust bores, the second exhaust bores acting also as the suction bores, wherein said grooves are formed independently for each of said suction bores.

According to this feature of the invention, even when a difference occurs in the timing of suction and in suction force between the suction bores, flows of the gas exhausted through the grooves and suction bores will not interfere with one another.

(5) An apparatus comprising grooves formed in the upper surface of the heat-treating plate to communicate with the suction bores, further comprising supply bores formed in said heat-treating plate for supplying gas into said space, said supply bores being formed in positions spaced from said grooves.

(6) An apparatus comprising grooves formed in the upper surface of the heat-treating plate to communicate with the second exhaust bores, the second exhaust bores acting also as the suction bores, further comprising supply bores formed in said heat-treating plate for supplying gas into said space, said supply bores being formed in positions spaced from said grooves.

According to this feature of the invention, the gas supplied from the supply bores flows into the grooves through the space. When the gas is supplied, the pressure in the grooves never becomes higher than that in the space. Thus, the second sheet-like object will never lift from the heat-treating plate.

(7) A heat-treatment apparatus for heat-treating a substrate, comprising a heat-treating plate, and suction bores formed in said heat-treating plate for applying suction at an upper surface of said heat-treating plate, wherein said heat-treating plate is formed of a porous material, said suction bores being pores of said heat-treating plate.

According to this feature, there is no need to form suction bores extending through the heat-treating plate.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 7 is a view in vertical section showing an outline of a heat treatment apparatus in Embodiment 2;

DESCRIPTION OF THE PREFERRED EMBODIMENTS

Preferred embodiments of this invention will be described in detail hereinafter with reference to the drawings.

Embodiment 1

Embodiment 1 of this invention will be described hereinafter with reference to the drawings.

Figure 1:
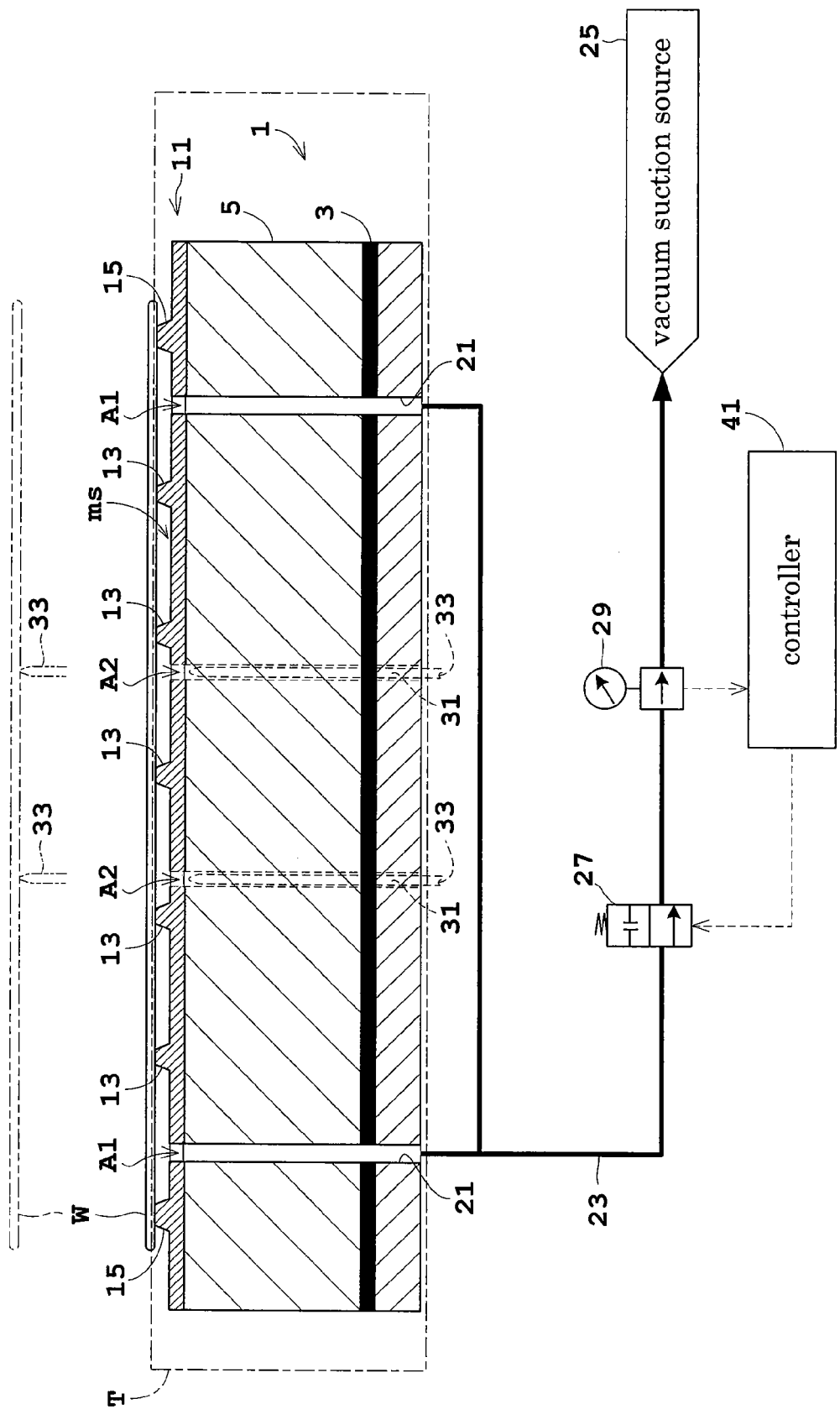
FIG. 1 is a view in vertical section showing an outline of a heat treatment apparatus in Embodiment 1.
Figure 2:
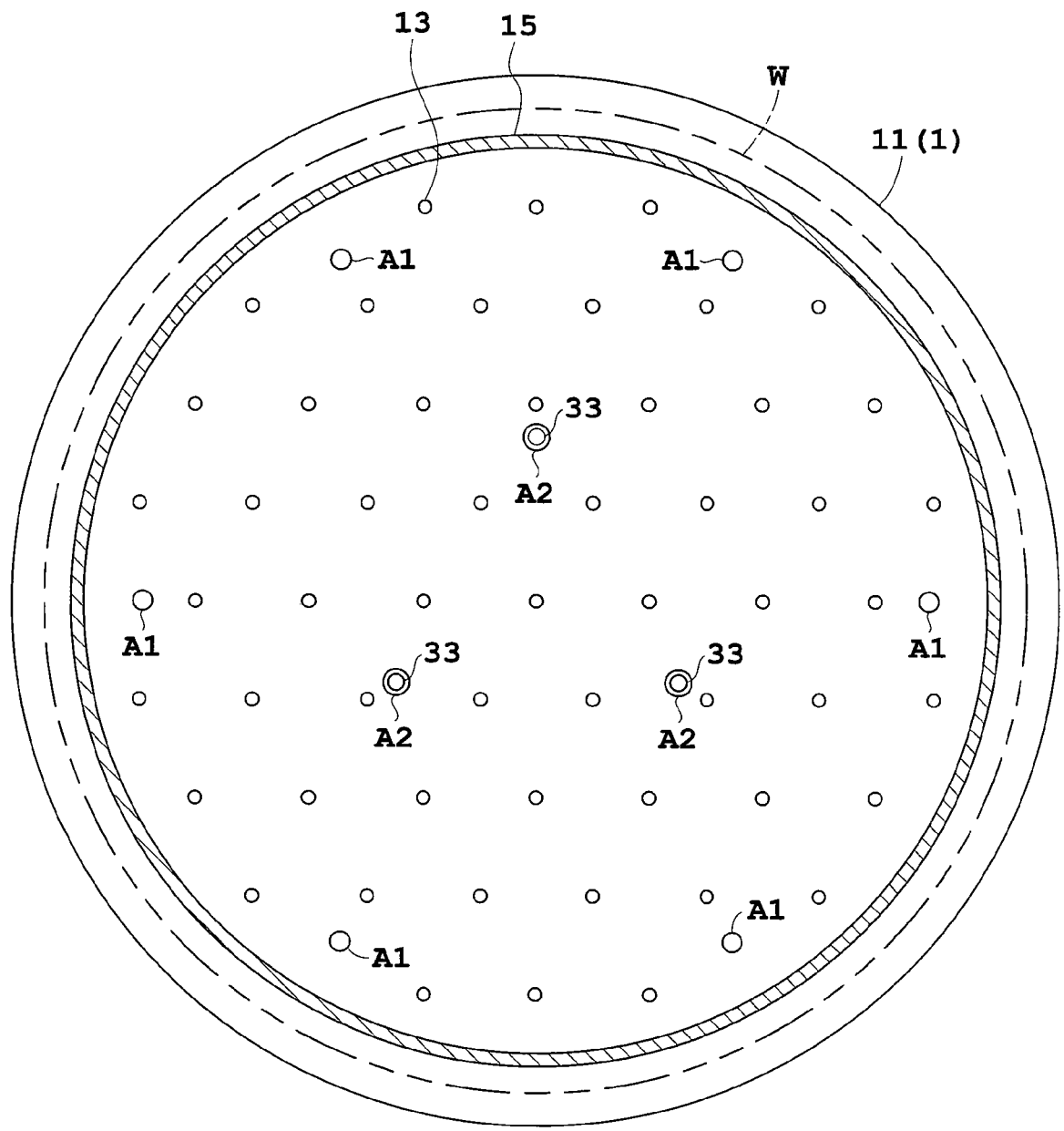
FIG. 2 is a plan view of a heat-treating plate.

FIG. 1 is a view in vertical section showing an outline of a heat treatment apparatus in Embodiment 1. FIG. 2 is a plan view of a heat-treating plate.

A heat-treating plate 1 is circular and has a slightly larger diameter than a wafer W in plan view. The upper surface of the plate 1 is flat. The heat-treating plate 1 is formed of a metal such as copper or aluminum having high thermal conductivity, for example. The heat-treating plate 1 has a heating element 3 such as a mica heater mounted therein. A heat transfer portion 5 between the heating element 3 and the upper surface of heat-treating plate 1 has a plurality of heat pipes, not shown, embedded therein. Cooling grooves, not shown, are formed between the heat pipes for circulating a cooling fluid. The heat-treating plate 1 corresponds to the plate body in this invention. The heating element 3 corresponds to the heating device in this invention.

A support sheet 11 is laid on the upper surface of the heat-treating plate 1. The heat-treating plate 1 and support sheet 11 constitute a substrate support structure T. In 6 this embodiment, the support sheet 11 is placed simply to rest on the heat-treating plate 1 without being fixed or bonded thereto. This is because the support sheet 11 and heat-treating plate 1 have a difference in thermal expansion therebetween.

The support sheet 11 has, formed on the upper surface thereof, a plurality of projections 13 for contacting and supporting the lower surface of the wafer W, and a lip 15 for contacting edge regions of the wafer W. The support sheet 11 includes first openings A1 and second openings A2 vertically extending therethrough. Further, the support sheet 11 has a flat bottom surface.

The plurality of projections 13 are arranged regularly. Each projection 13 is pillar-shaped to rise above the surrounding area, with a diameter slightly enlarging from an upper end that contacts the wafer W to a lower end. Its angle of inclination is about 30 degrees, for example. The upper end of each projection 13 is 0.5 mm in diameter, for example. The height of projections 13 is, for example, 75 μm from recesses of the support sheet 11, and 125 μm from the back surface of the support sheet 11. Each of these sizes is given by way of example and is not limited to the value noted above. That is, the diameter of the upper end of each projection 13 can be varied as appropriate in a range of 0.1 to 1 mm, or may exceed this range. The height of the projections 13 from the recesses of the support sheet 11 can be varied as appropriate in a range of 65 to 85 μm, or may exceed this range. The thickness of the support sheet 11 itself can be varied as appropriate. In this embodiment, the height of projections 13 is selected to be 50% or more of the thickness (125 μm) of the support sheet 11, by taking into account that the bores are formed by etching the support sheet 11 at the opposite surfaces as described hereinafter.

The lip 15 is ring-shaped in plan view, with a diameter slightly smaller than the outside diameter of the wafer W. The lip 15 has the same height as the projections 13. Thus, the lip 15 contacts the wafer W to close lateral areas of a space (hereinafter called minute space "ms") formed between the wafer W and the support sheet 11.

The first openings A1 are formed for exhausting gas from the minute space "ms". The plurality of (e.g. six) first openings A1 are arranged inwardly of the lip 15. The second openings A2 are formed for receiving lift pins 33. The plurality of (e.g. three) second openings A2 are formed in positions corresponding to the apexes of an equilateral triangle centering on the center of heat-treating plate 1 in plan view.

The heat-treating plate 1 has, formed to extend between the upper and lower surfaces thereof, exhaust bores 21 in communication with the first openings A1, and through-holes 31 opposed to the second openings A2. One end of exhaust piping 23 is connected commonly to these exhaust bores 21. A vacuum suction source 25 is connected to the other end of the exhaust piping 23. This vacuum suction source 25 is a vacuum utility provided for a cleanroom, for example. The exhaust piping 23 has a switch valve 27 for regulating pressure (negative pressure), and a pressure gauge 29 for measuring the pressure. The exhaust piping 23 and vacuum suction source 25 function as an exhaust device. The lift pins 33 are inserted in the through-holes 31, respectively. The lift pins 33 have lower ends thereof connected to a lift mechanism not shown. Thus, the lift pins 33 are vertically movable to transfer the wafer W to and from a transport device not shown.

A controller 41 performs an overall control of the apparatus, i.e. controls output of the heating element 3 noted hereinbefore, switching operation of the switch valve 27, and driving of the lift mechanism. These controls are performed based on a recipe stored beforehand. The switching operation of the switch valve 27 is based on results of detection by the pressure gauge 29. The controller 41 is realized by a central processing unit (CPU) which performs various processes, a RAM (Random Access Memory) used as the workspace for operation processes, and a storage medium such as a fixed disk for storing a variety of information.

The materials for the support sheet 11 and its manufacturing method will now be described. The support sheet 11 is formed of resin. The type of resin is selected as appropriate according to the nature of treatment. In the case of the heat treatment apparatus as in this embodiment, a heat-resistant resin is desirable. Further, it is preferred that the resin is resistant to chemicals also. Specifically, such a material may, for example, be polyimide, polytetrafluoroethylene (PTFE), polychlorotrifluoroethylene (PCTFE), polyetheretherketone (PEEK), polyphenylene sulphide (PPS), polyvinylidene fluoride (PVDF), polyethersulfone (PES), polysulfone (PSF), polyetherimide (PEI), or a heat-resistant rubber material. Further, the support sheet 11 may be formed of a porous material.

Figure 3A:
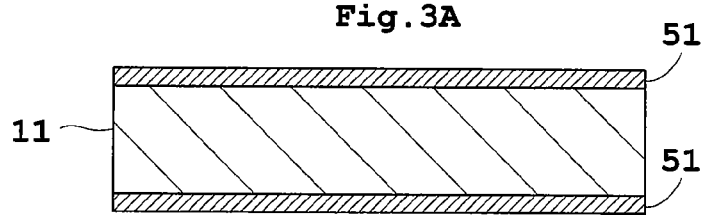
FIGS. 3A through 3E are explanatory views showing an etching process.
Figure 3B:
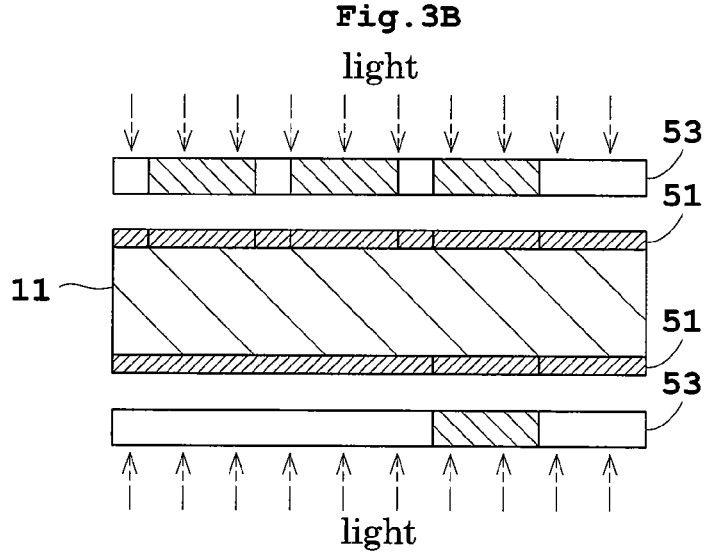
Figure 3C:
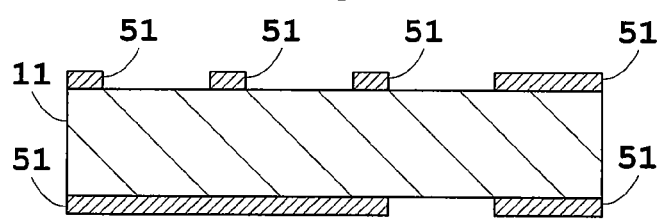
Figure 3D:
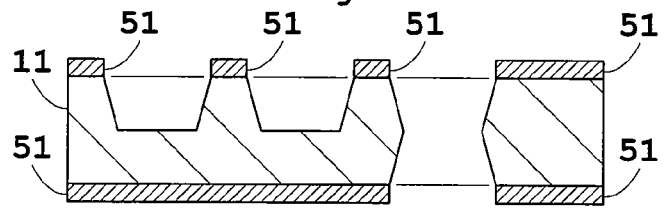
Figure 3E:
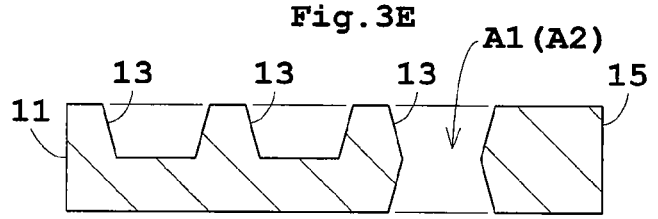

The support sheet 11 is formed by an etching process. This etching process will be described by referring to FIGS. 3A through 3E. First, a resist is applied to the support sheet 11 having the surfaces cleaned beforehand, to form a uniform photoresist film 51 on the front and back surfaces (FIG. 3A). Next, the photoresist film 51 is exposed using etching patterns 53 formed on glass film plates or the like, to transfer the patterns to the photoresist film 51 on the opposite surfaces of the support sheet 11 (FIG. 3B). Next, the film is removed from unexposed areas to uncover the support sheet 11 (FIG. 3C). Next, an etching process is carried out to etch the uncovered areas of the support sheet 11 (FIG. 3D). Finally, the resist sensitization film is removed from the support sheet 11 having undergone the etching process (FIG. 3E). The parts remaining unetched act as the projections 13 and lip 15. The parts etched at only one surface (front surface) serve as the recesses (parts of reduced thickness) of the support sheet 11. The parts etched at the opposite surfaces become the first and second openings A1 and A2.

The support sheet 11 formed in this way is laid, with the flat back surface facing down, on the heat-treating plate 1. At this time, the support sheet 11 may be attached fast to the heat-treating plate 1, or may be placed simply to rest on the heat-treating plate 1. The support sheet 11 corresponds to the first sheet-like object in this invention.

Figure 4:
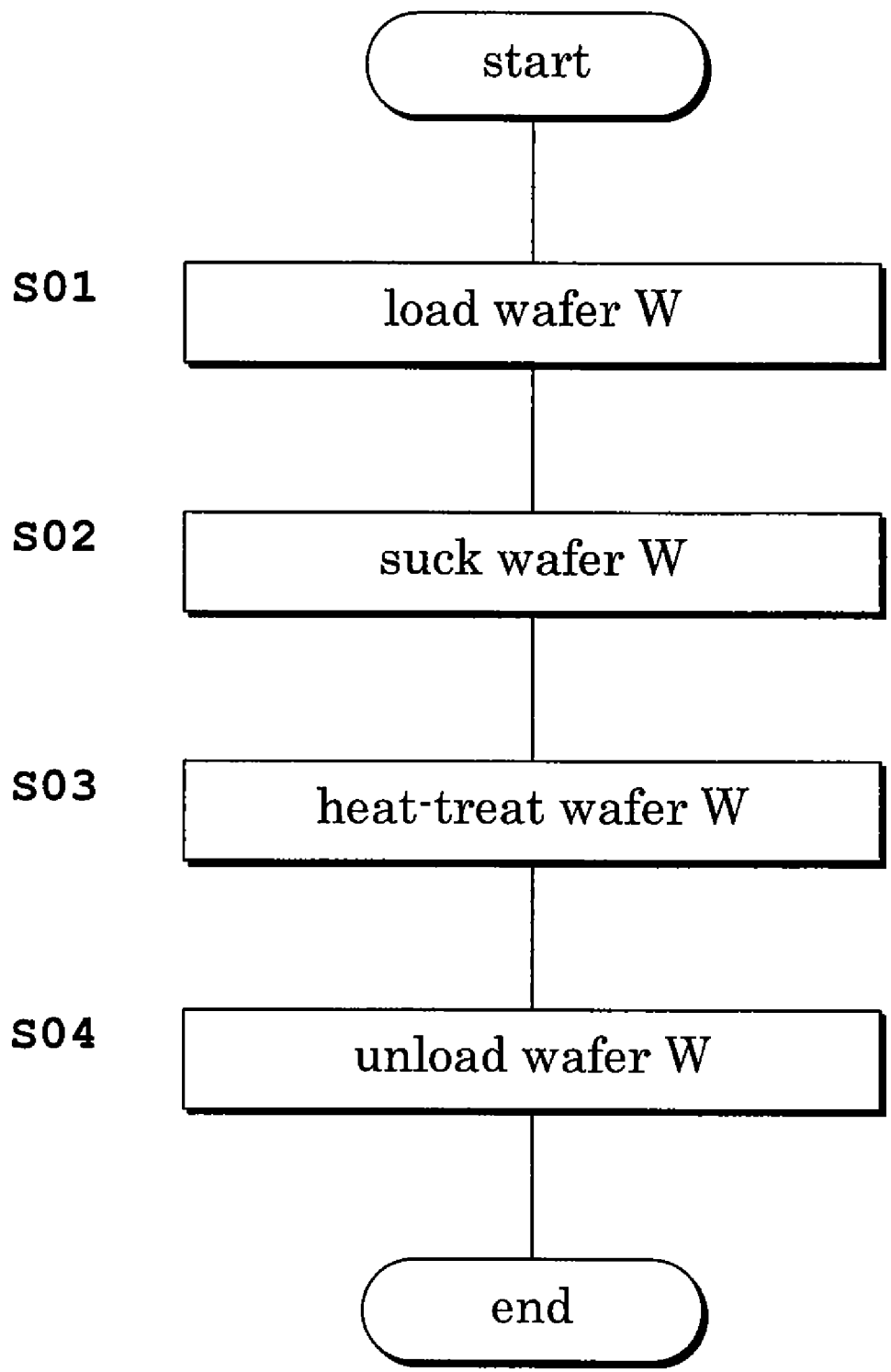
FIG. 4 is a flow chart showing a procedure of treatment by the heat treatment apparatus.

Operation of the heat treatment apparatus having the above construction will be described briefly with reference to FIG. 4. FIG. 4 is a flow chart showing a procedure of treatment by the heat treatment apparatus. Temperature control of the heating element 3, for example, is assumed to have already been carried out according to the recipe, and will be omitted from the following description.

<Step S01> Load Wafer W

The controller 41 drives the lift mechanism to raise the lift pins 33 and receive a wafer W from the transport 6 device not shown. Then, the lift pins 33 are lowered to place the wafer W on the support sheet 11. At this time, the lower surface of the wafer W contacts the projections 13 and lip 15. Consequently, the closed minute space "ms" is formed between the wafer W and support sheet 11.

<Step S02> Suck Wafer W

The controller 41 opens the switch valve 27 to exhaust the gas (i.e. air or nitrogen) in the minute space "ms" through the first openings A1 and exhaust bores 21. The pressure in the minute space "ms" is adjusted to a negative pressure, and the wafer W is sucked toward the heat-treating plate 1.

<Step S03> Heat-Treat Wafer W

A predetermined heat treatment is carried out for the wafer W while maintaining the wafer W in the suction-supported state for a predetermined time.

<Step S04> Unload Wafer W

Upon completion of the heat treatment performed for the predetermined time, the controller 41 closes the switch valve 27 to return the pressure in the minute space "ms" to atmospheric pressure. Next, the lift pins 33 are raised to push up the wafer W and transfer the wafer W to the transport device not shown.

According to this embodiment, as described above, since the support sheet 11 is formed by an etching process, areas around the projections 13 (i.e. portions other than the projections 13) can be made into recesses rather than openings. That is, with punching or cutting by laser processing, projections cannot be formed unless the support sheet 11 is cut open. Thus, the portions other than the projections will inevitably become perforations. With the etching process, such perforations need not be formed.

Such support sheet 11 can inhibit variations in heat history over the surface of wafer W. With a support sheet in which areas around projections (i.e. portions other than the projections) are perforations, the heat-treating plate 1 would be exposed through the perforations when the support sheet is placed on the heat-treating plate 1. Consequently, great variations in heat history would occur over the surface of the wafer W between contact parts in contact with the projections and non-contact parts out of contact with the projections. When the temperature of the upper surface of heat-treating plate 1 varies from position to position, the temperature of the wafer W will easily vary from position to position under its strong influence. However, the support sheet 11, since the areas around the projections are not perforations, is free from the above inconvenience.

Since the support sheet 11 is formed by an etching process, the projections 13 can be formed in a free pattern, with no restrictions as to the positions or number thereof. The size of projections 13 can easily be mad e minute. Formed with a fixed angle of inclination, the projections 13 do not buckle easily, and are not damaged easily. The support sheet 11 having such projections 13 formed thereon is provided for the heat-treating plate 1 whereby, while covering the heat-treating plate 1 with the support sheet 11, the resulting substrate support structure T realizes a reduced contact area of the projections 13 for the area of wafer W.

Since the support sheet 11 has no openings other than the first openings A1 and second openings A2, the support sheet 11 as a whole has certain strength. Thus, the support sheet 11 is easy to handle, and the substrate support structure T can be manufactured easily.

Since the back surface of the support sheet 11 is flat, the support sheet 11 can be placed on the heat-treating plate 1 without impairing the shape of the front surface having the projections 13 formed thereon. Therefore, the support sheet 11 and heat-treating plate 1 can constitute the appropriate substrate support structure T.

The lip 15 formed by the etching process can appropriately close the areas laterally of the minute space "ms". As a result, the wafer W can be sucked effectively.

The heat treatment apparatus with the heating element 3 is capable of excellent heat treatment for heating the wafer W.

This invention is not limited to the foregoing embodiment, but may be modified as follows:

(1) The substrate support structure T has been described in Embodiment 1 above only by way of example. The pattern of projections 13 formed by an etching process, i.e., the size, shape, positions, number and so on of projections 13, may be changed as desired.

Figure 5:
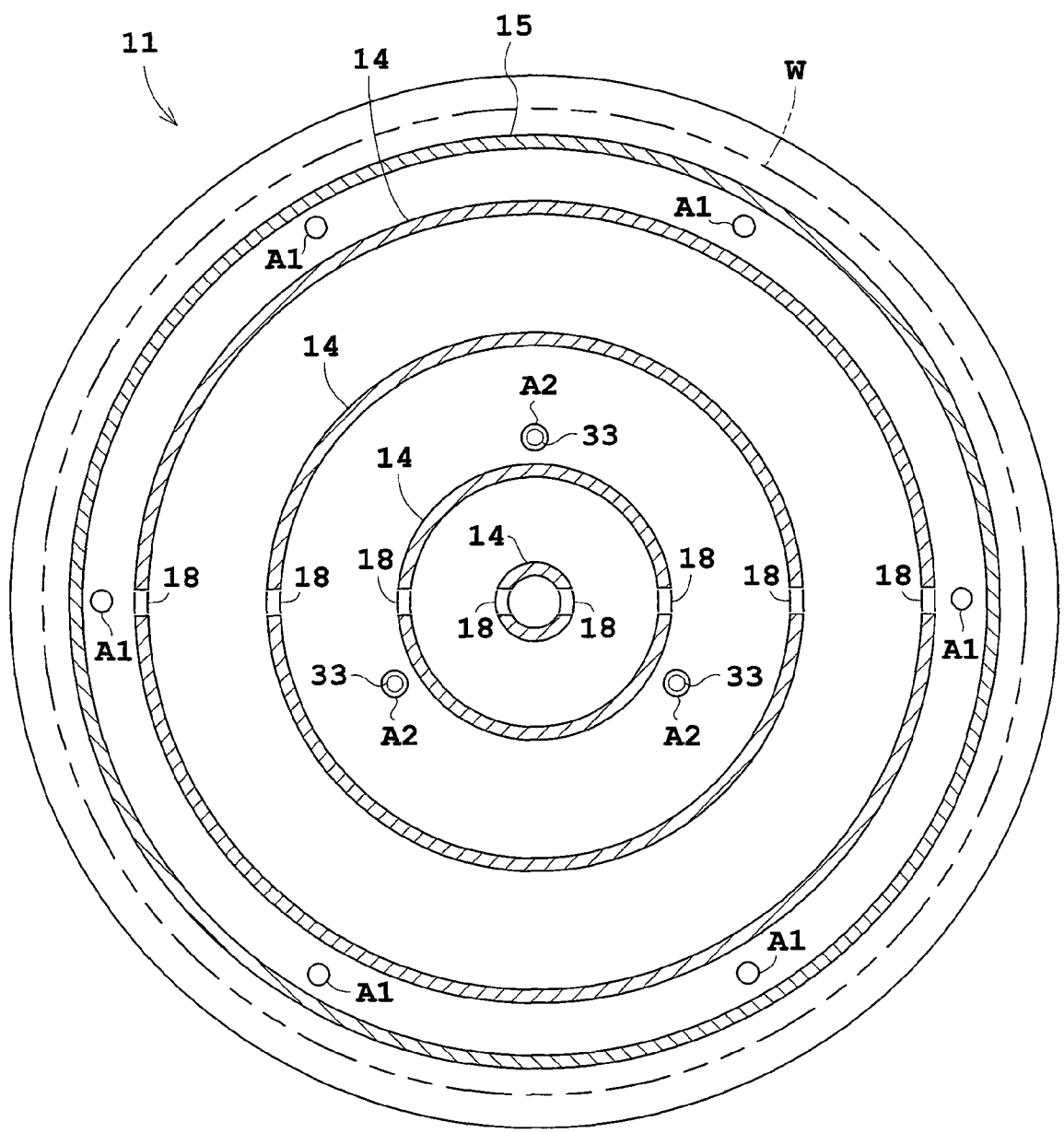
FIG. 5 is a plan view of a modified support sheet.
Figure 6:
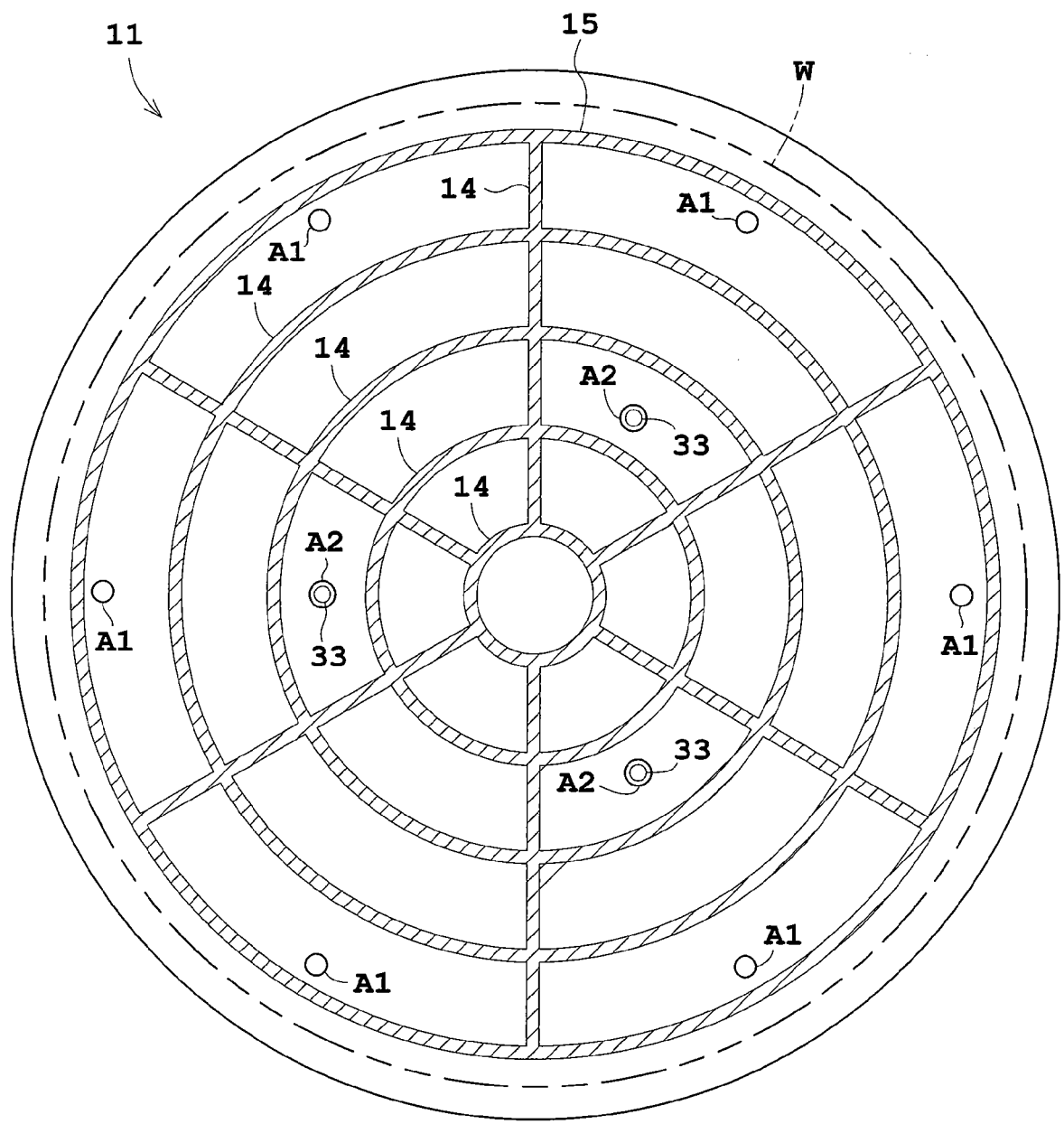
FIG. 6 is a plan view of another modified support sheet.

FIGS. 5 and 6 show modifications concerning the pattern of projections 13. FIG. 5 is a plan view of a modified support sheet 11. As seen, four ring-like projections 14 are formed. These projections 14 are different in diameter, and are arranged concentrically. Grooves 18 are formed in varied positions of each projection 14 to serve as vents. Thus, even when the projections 14 contact a wafer W, communication is made between regions inside and outside each projection 14. This construction can properly reduce the pressure in the minute space "ms" to negative pressure by exhausting the gas from the minute space "ms" in any selected positions.

FIG. 6 is a plan view of another modified support sheet 11. As seen, the support sheet 11 has four projections 14 different in diameter and arranged in concentric circles, and six projections 14 radially extending from the innermost projection 14 to the lip 15. As a result, the projections 14 and lip 15 are connected in various locations without being separated. In this case also, grooves may be formed in each projection 14.

(2) In Embodiment 1 described hereinbefore, the first openings A1 and second openings A2 are formed by an etching process. The first and second openings A1 and A2 may be formed by a method other than the etching process.

(3) In Embodiment 1 described hereinbefore, the support sheet 11 is placed simply and directly on the heat-treating plate 1 without being fixed or bonded thereto. This is not limitative. The support sheet 11 may be fixed or bonded to the heat-treating plate 1. The support sheet 11 may be placed on the heat-treating plate 1 with a substance interposed therebetween that facilitates horizontal sliding movement. The support sheet 11 may be placed with a device provided on the heat-treating plate 1 for restricting displacement of the support sheet 11 relative to the heat-treating plate 1.

(4) In Embodiment 1 described hereinbefore, each projection 13 has a diameter enlarging from top to bottom. Each projection 13 is not limited to this shape, but may have the same diameter from top to bottom.

(5) In Embodiment 1 described hereinbefore, the heating element 3 is mounted in the heat-treating plate 1. This is not limitative. For example, a heater may be provided above the wafer W to heat the wafer W from above.

(6) In Embodiment 1 described hereinbefore, the lip 15 is formed on the support sheet 11. However, the lip 15 may be omitted. In this case, the openings A1, exhaust bores 21, exhaust piping 23 and other components for reducing the interior of minute space "ms" to negative pressure may also be omitted.

(7) In Embodiment 1 described hereinbefore, the heat-treating plate 1 is formed of metal. Instead, the heat-treating plate 1 may be formed of ceramics, for example.

(8) In Embodiment 1 described hereinbefore, the heat treatment apparatus performs heat treatment for heating the wafer W with the heating element 3. Instead, the apparatus may perform heat treatment for cooling the wafer W with a cool plate. The substrate support structure T described in this embodiment may be applied to an apparatus that performs other treatment such as cleaning treatment or coating treatment. The substrate support structure T in this embodiment can be applied where the wafer W is supported for spinning motion, by providing a motor for spinning the heat-treating plate 1.

Embodiment 2

Embodiment 2 of this invention will be described hereinafter with reference to the drawings.

Figure 8A:
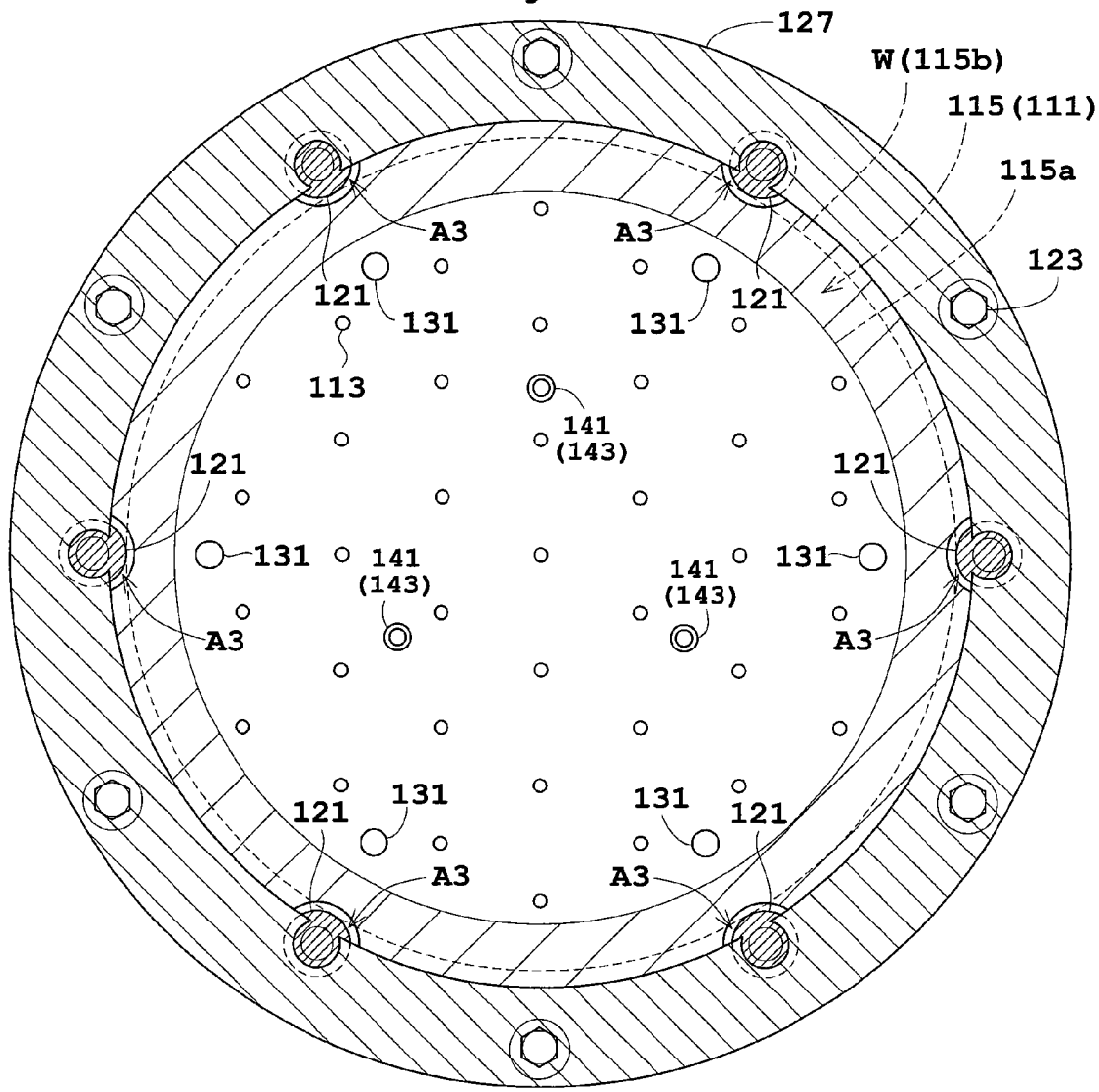
FIG. 8A is a plan view of a heat-treating plate.
Figure 8B:
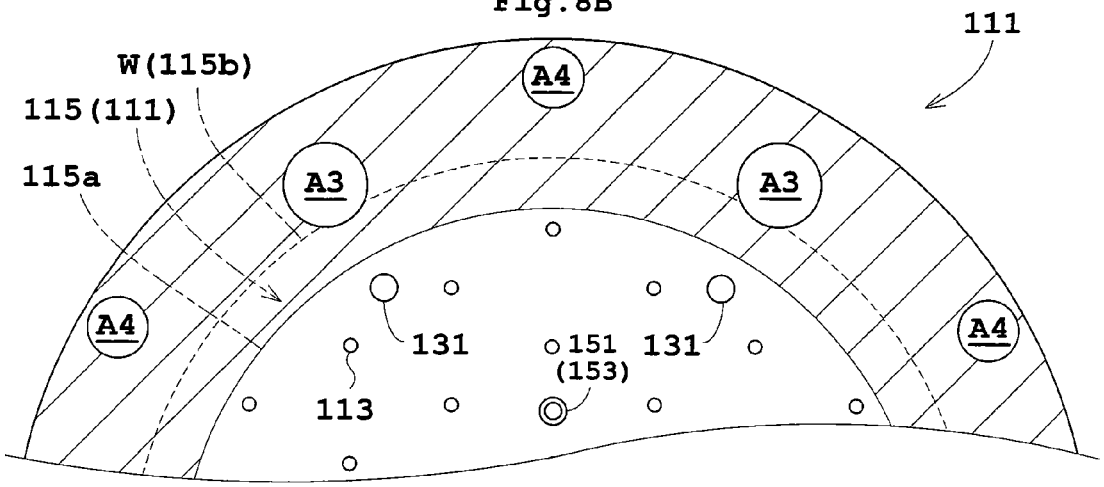
FIG. 8B is a fragmentary plan view of a support sheet.

FIG. 7 is a view in vertical section showing an outline of a heat treatment apparatus in Embodiment 2. FIG. 8A is a plan view of a heat-treating plate. FIG. 8B is a fragmentary plan view of a support sheet.

A heat-treating plate 101 is circular and has a slightly larger diameter than a wafer W in plan view. The upper surface of the plate 101 is flat. The heat-treating plate 101 is formed of a metal such as copper or aluminum having high thermal conductivity, for example. The heat-treating plate 101 has a heating element 103 such as a mica heater mounted therein. A heat transfer portion 105 between the heating element 103 and the upper surface of heat-treating plate 101 has a plurality of heat pipes, not shown, embedded therein. Cooling grooves, not shown, are formed between the heat pipes for circulating a cooling fluid.

A support sheet 111 formed of resin is laid on the upper surface of the heat-treating plate 101. The support sheet 111 has projections 113 and a sealer 115 formed on the upper surface thereof. The support sheet 111 includes third openings A3 and fourth openings A4 formed outwardly of the sealer 115. Such support sheet 111 is placed on the upper surface of the heat-treating plate 101 to be deformable according to temperature, without being accompanied by creases, bending and the like. More particularly, the support sheet 111 is subjected to temperature changes in a relatively large range (e.g. from room temperature to treating temperature (about 200 degrees)) in time of heat treatment. Since the support sheet 111 has a coefficient of thermal expansion different to the heat-treating plate 101, the support sheet 111 is displaced (through expansion and contraction) horizontally (i.e. in directions parallel to the surface) relative to the heat-treating plate 101. The support sheet 111 is placed on the heat-treating plate 101 to be freely displaceable (through expansion and contraction) relative to the heat-treating plate 101 without being accompanied by creases, bending and the like. Specifically, the support sheet 111 may be placed directly on the heat-treating plate 101 without being fixed or bonded thereto, or may be placed on the heat-treating plate 101 with a substance interposed therebetween that facilitates horizontal sliding movement. The support sheet 111 corresponds to the second sheet-like object in this invention.

The plurality of (37 in FIG. 8A) projections 113 are arranged regularly. Each projection 113 is pillar-shaped, with a diameter slightly enlarging from an upper end to a lower end. The height of projections 113 is, for example, 75 μm from recesses of the support sheet 111, and 125 μm from the back surface of the support sheet 111. The upper ends of the projections 113 contact and support the wafer W.

The sealer 115 is ring-shaped in plan view, with a diameter slightly smaller than the outside diameter of the wafer W, and surrounds the projections 113. The sealer 115 has the same height as the projections 113. Thus, the sealer 115 contacts the wafer W to close lateral areas of a space (hereinafter called minute space "ms") formed between the wafer W and the support sheet 111. The support sheet 111 in Embodiment 2 is formed integral to have the same height from the sealer 115 to the outer periphery of the support sheet 111. Therefore, in FIG. 8B, the range from the sealer 115 to the outer periphery of the support sheet 111 is shown in hatches. However, the sealer 115 is a portion that contacts edges of the wafer W, and corresponds to the range between inner peripheral circle 115a and outer peripheral circle 115b in FIGS. 8A and 8B. In this specification, the portion of the support sheet 111 lying outwardly of the outer peripheral circle 115b in plan view is called "the portion outside the sealer 115".

The plurality of (e.g. six) openings A3 are formed at equal intervals in contact with the outer peripheral circle 115b of the sealer 115. The plurality of (e.g. six) fourth openings A4 are formed between the third openings A3 and closer to the edge of the support sheet 111 than the third openings A3.

A method of manufacturing the support sheet 111 and materials usable therefor will now be described. In this embodiment, the support sheet 111 is formed of a heat-resistant resin. It is preferred that the resin is resistant to chemicals also. Specifically, such material may, for example, be polyimide, polytetrafluoroethylene (PTFE), polychlorotrifluoroethylene (PCTFE), polyetheretherketone (PEEK), polyphenylene sulphide (PPS), polyvinylidene fluoride (PVDF), polyethersulfone (PES), polysulfone (PSF), polyetherimide (PEI), or a heat-resistant rubber material. However, the method of manufacturing the support sheet 111 is not limited to the above. For example, the projections 113 and sealer 115 may be formed by welding to a resin film or sheet, respectively. The support sheet 111 may be formed integral.

The heat-treating plate 101 has, arranged thereon, guides 121, bolts 123, retaining rings 125 and a guiding ring 127 besides the support sheet 111. The guides 121 serve to determine a horizontal position of the wafer W, and are shaped approximately cylindrical, each with a slope formed on an upper portion thereof. Preferably, the guides 121 are formed of PEEK material which does no damage to the wafer W. A plurality of (e.g. six) such guides 121 are arranged in the third openings A3 of the support sheet 111, respectively. Thus, the guides 121 are placed directly on the heat-treating plate 101. The guides 121 are not fixed or bonded to the heat-treating plate 101. The sizes, positions and so on of the guides 121 and third openings A3 are determined so that, when the guides 121 are arranged in place, large enough gaps are formed between the third openings A3 (edges of the third openings A3) and guides 121 for permitting expansion and contraction of the support sheet 111. The guides 121 correspond to the guide elements (particularly the guide elements acting also as the insert elements) in this invention.

The guiding ring 127 is an annular plate-like object defining hollow portions surrounding the guides 121 in plan view. The guiding ring 127 has substantially semicircular cutouts formed in inner peripheral positions thereof for contacting parts of the slopes of the respective guides 121. Further, the guiding ring 127 has six through-holes formed in positions corresponding to the fourth openings A4. Bolts 123 are inserted in the through-holes. In order to prevent the guiding ring 127 separating from the bolts 123, retaining rings 125 are attached to the bolts 123. A lower portion of each bolt 123 extends through the fourth opening A4 to be fixed to the heat-treating plate 101. The bolts 123 and fourth openings A4 have gaps therebetween comparable to or larger than the gaps between the guides 121 and third openings A3.

When the guides 121 and bolts 123 are in place, the guiding ring 127 is in contact with the guides 121 and slightly afloat above the retaining rings 125. Thus, the guiding ring 127 adjusts the positions of the guides 121. At this time, a small space is formed between the lower surface of guiding ring 127 and the upper surface of support sheet 111. In this embodiment, the portion of support sheet 111 outside the sealer 115 is 125 μm thick, and the lower surface of guiding ring 127 is located 300 μm above the upper surface of heat-treating plate 101, so that a space of 175 μm is formed between the support sheet 111 and guiding ring 127. The guiding ring 127 corresponds to a positioning member in this invention.

This embodiment provides first exhaust bores 131 and through-holes 141 extending through the heat-treating plate 101 and support sheet 111.

The first exhaust bores 131 are formed for exhausting gas from the minute space "ms". The plurality of (i.e. six) first exhaust bores 131 are commonly connected, at the lower surface of the heat-treating plate 101, to one end of exhaust piping 133. A vacuum suction source 135 is connected to the other end of the exhaust piping 133. This vacuum suction source 135 is a vacuum utility provided for a cleanroom, for example. The exhaust piping 133 has a switch valve 137 for regulating pressure (negative pressure), and a pressure gauge 139 for measuring the pressure. The exhaust piping 133 and vacuum suction source 135 function as an exhaust device.

The through-holes 141 are formed for receiving lift pins 143. Three through-holes 141 are formed in positions corresponding to the apexes of an equilateral triangle centering on the center of heat-treating plate 101 in plan view. The lift pins 143 inserted in the through-holes 141, respectively, have lower ends thereof connected to a lift mechanism not shown. Thus, the lift pins 143 are vertically movable by the lift mechanism to transfer the wafer W to and from a transport device not shown.

A controller 151 performs an overall control of the apparatus, i.e. controls output of the heating element 103 noted hereinbefore, switching operation of the switch valve 137, and driving of the lift mechanism. These controls are performed based on a recipe stored beforehand. The switching operation of the switch valve 137 is based on results of detection by the pressure gauge 139. The controller 151 is realized by a central processing unit (CPU) which performs various processes, a RAM (Random Access Memory) used as the workspace for operation processes, and a storage medium such as a fixed disk for storing a variety of information.

Figure 9:
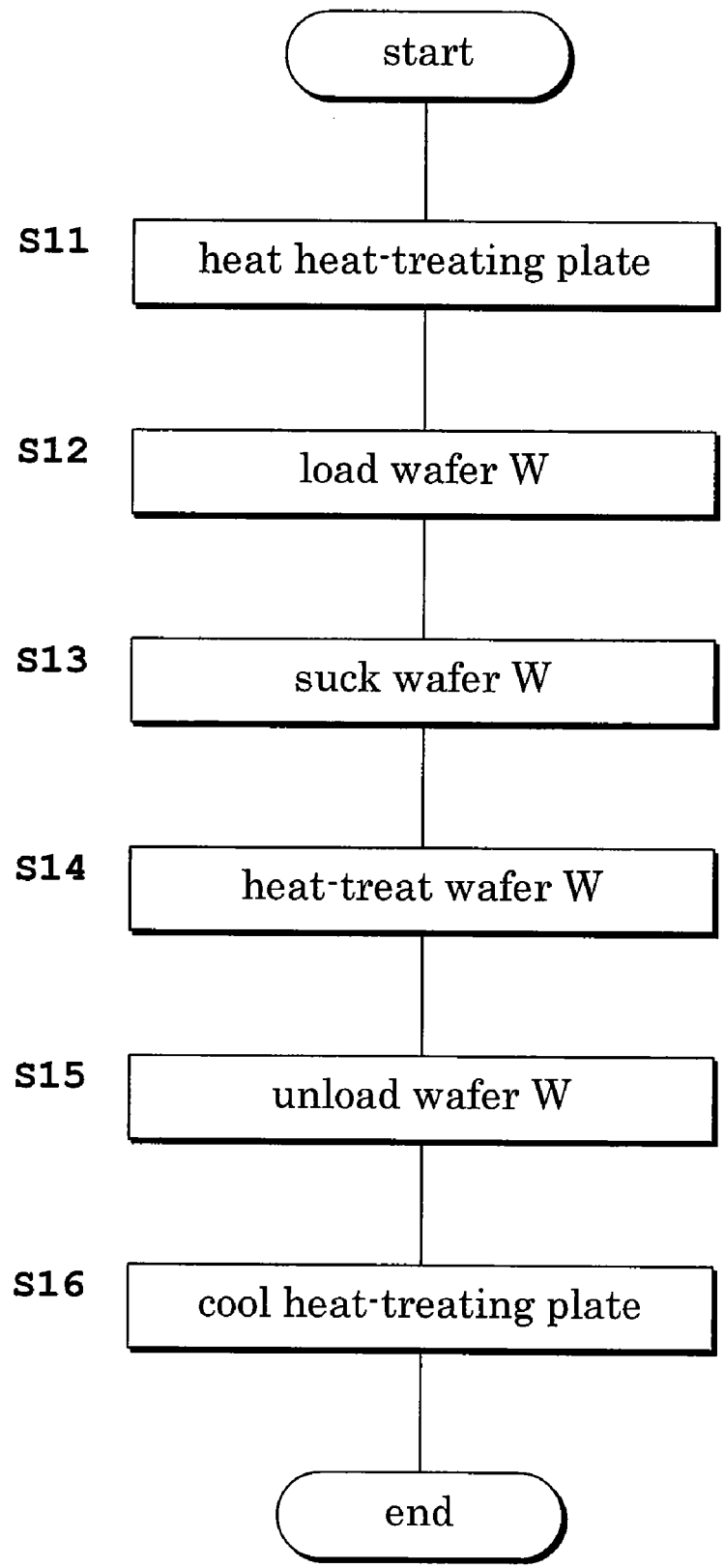
FIG. 9 is a flow chart showing a procedure of treatment by the heat treatment apparatus.

Operation of the heat treatment apparatus in Embodiment 2 will be described next. FIG. 9 is a flow chart showing a procedure of heat treatment.

<Step S11> Heat Heat-Treating Plate

Figure 10:
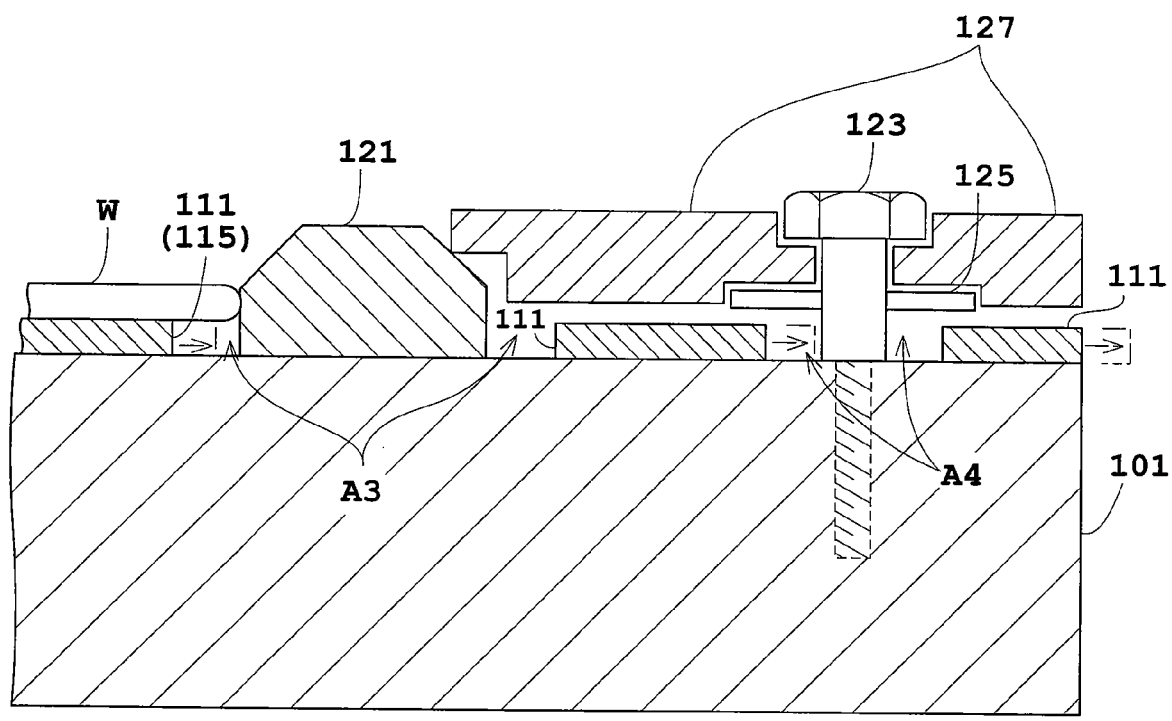
FIG. 10 is a view schematically showing expansion of the support sheet.

The controller 151 operates the heating element 103 to control the heat-treating plate 101 to a predetermined treating temperature. At this time, the support sheet 111 is displaced (i.e. expands or contracts) relative to the heat-treating plate 101. FIG. 10 schematically shows a state of expansion of the support sheet 111. As seen, the support sheet 111 shown in solid lines deforms (i.e. expands) to a position shown in alternate long and short dash lines. However, even when the support sheet 111 expands in this way, the guides 121 do not interfere with the support sheet 111 since the predetermined gaps are formed between the third openings A3 (edges of the third openings A3) and guides 121. Thus, an expansion or contraction of the support sheet 111 causes no creases or bending of the support sheet 111.

<Step S12> Load Wafer W

The controller 151 drives the lift mechanism for causing the lift pins 143 to receive a wafer W from the transport device and to place the wafer W on the support sheet 111. At this time, the wafer W is positioned by the guides 121. The wafer W is contacted and supported by the projections 113. The sealer 115 closes the areas laterally of the minute space "ms" formed between the wafer W and support sheet 111.

<Step S13> Suck Wafer W

The controller 151, while referring to results of measurement by the pressure gauge 139, operates the switch valve 137 to exhaust the gas from the minute space "ms". The pressure in the minute space "ms" is adjusted to a negative pressure, and the wafer W is sucked toward the heat-treating plate 101.

<Step S14> Heat-Treat Wafer W

A predetermined heat treatment is carried out for the wafer W while maintaining the wafer W in the suction-supported state for a predetermined time.

<Step S15> Unload Wafer W

Upon completion of the heat treatment performed for the predetermined time, the controller 151 closes the switch valve 137 to return the pressure in the minute space "ms" to atmospheric pressure. Next, the controller 151 controls the lift pins 33 to raise and unload wafer W.

Figure 11:
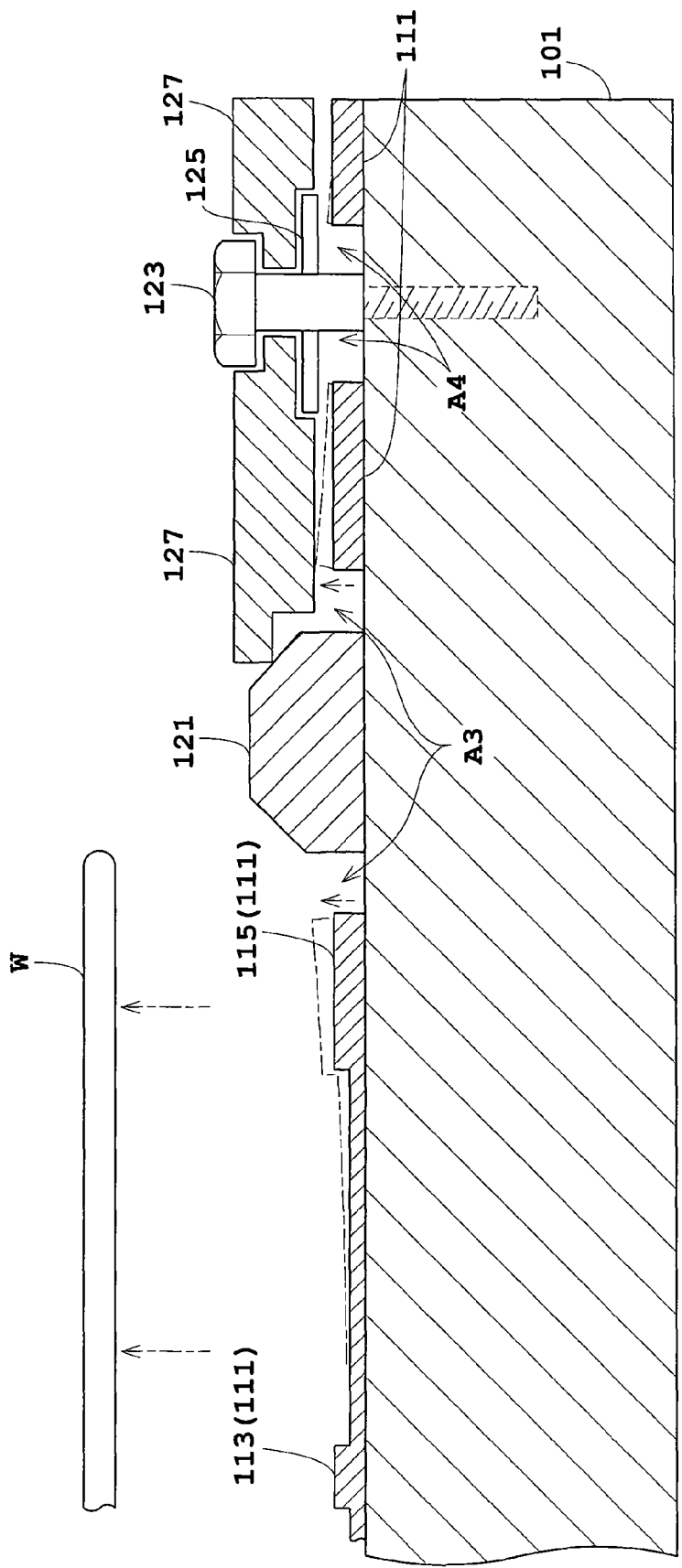
FIG. 11 is a view schematically showing the support sheet about to lift.

At this time, the support sheet 111 may tend to lift with the wafer W from the heat-treating plate 101. FIG. 11 is a view schematically showing the support sheet 111 about to lift. The guiding ring 127 is present with a small gap above the portion of the support sheet 111 outward of the sealer 115, thereby appropriately inhibiting lifting of the support sheet 111.

<Step S16> Cool Heat-Treating Plate

After heat-treating all wafers W to be treated, the controller 151 stops operation of the heating element 103. As a result, the heat-treating plate 101 cools to room temperature.

According to the heat treatment apparatus in Embodiment 2, the predetermined gaps between the third openings A3 and guides 121 enable expansion and contraction of the support sheet 111. The support sheet 111 is thus free from creases, bending and so on.

The guiding ring 127 is disposed above and slightly spaced from the portion of the support sheet 111 outward of the sealer 115, which reliably restricts lifting of the support sheet 111.

The support sheet 111 can be positionally adjusted by the guides 121 inserted in the third openings A3. The entire support sheet 111 can also be prevented from moving excessively relative to the heat-treating plate 101.

Embodiment 3

Embodiment 3 of this invention will be described with reference to FIG. 12.

Figure 12:
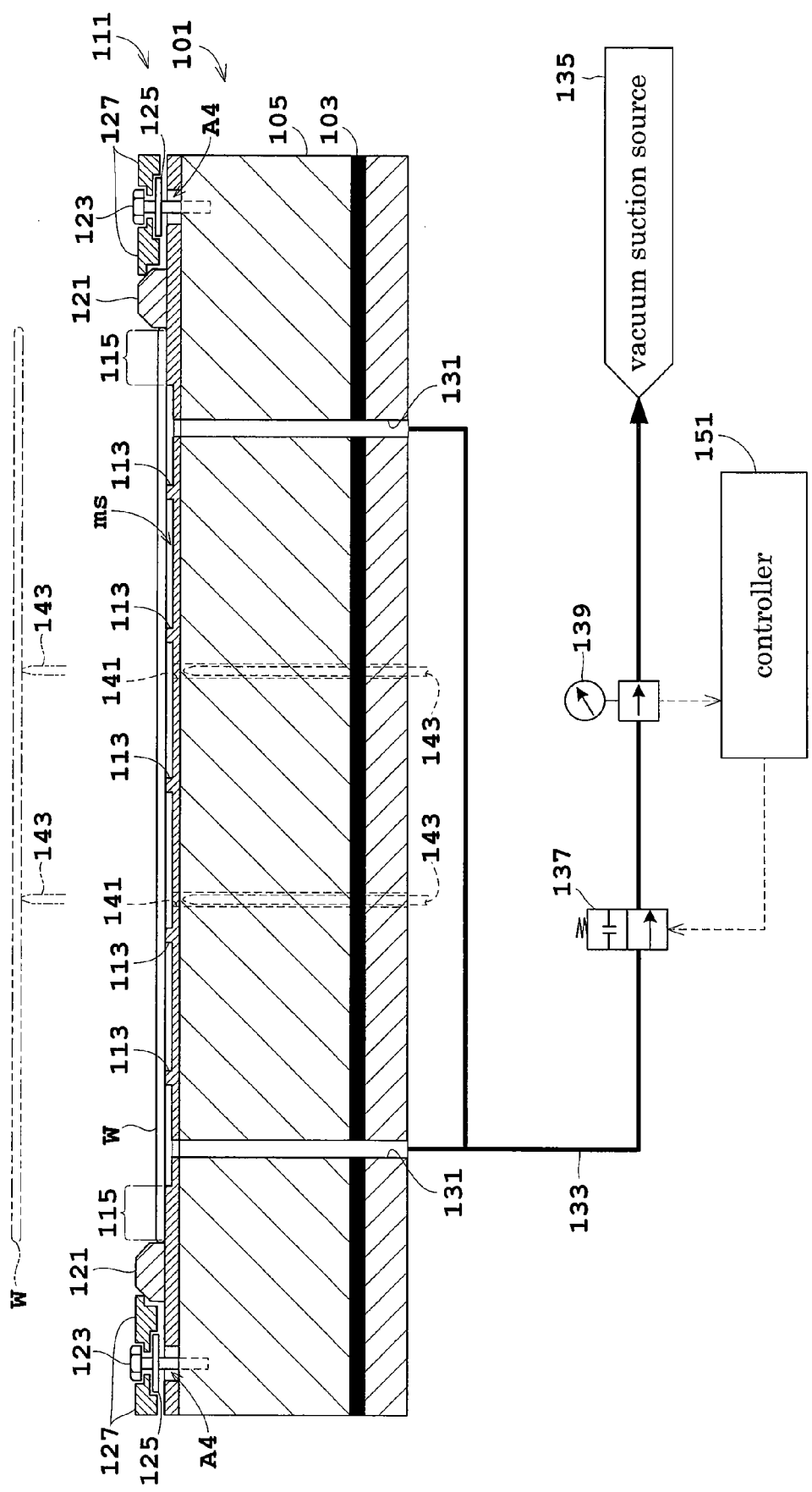
FIG. 12 is a view in vertical section showing an outline of a heat treatment apparatus in Embodiment 3.

FIG. 12 is a view in vertical section showing an outline of a heat treatment apparatus in Embodiment 3. Parts identical to those of Embodiment 2 are shown with the same reference numerals, and will not be described again.

The heat treatment apparatus in Embodiment 3 is characterized in that guides 121 are mounted on the support sheet 111. That is, the support sheet 111 in Embodiment 3 has the projections 113, sealer 115 and fourth openings A4, but does not include the third openings A3 described in Embodiment 2.

The guides 121 are placed directly in predetermined positions on the support sheet 111. Preferably, the guides 121 are lightweight to the extent of permitting expansion and contraction of the support sheet 111. The guides 121 correspond to the guide elements (particularly the guide elements acting also as the weights) in this invention. When a predetermined heat treatment is carried out by the heat treatment apparatus having this construction, the support sheet 111 expands and contracts with the guides 121 mounted thereon. The guides 121 move horizontally with the expansion and contraction.

Thus, the heat treatment apparatus in Embodiment 3 also permits horizontal expansion and contraction of the support sheet 111. When the support sheet 111 expands or contracts relative to the heat-treating plate 101, no creases or bending are produced on the support sheet 111.

Further, the guides 121 pressing the support sheet 111 down on the heat-treating plate 101 can prevent ambient air from flowing in between the support sheet 111 and heat-treating plate 101. This precludes an inconvenience of the gas having entered between the support sheet 111 and heat-treating plate 101 expanding and contracting to produce creases, bending and the like of the support sheet 111.

Embodiment 4

Embodiment 4 of this invention will be described with reference to FIG. 13.

Figure 13:
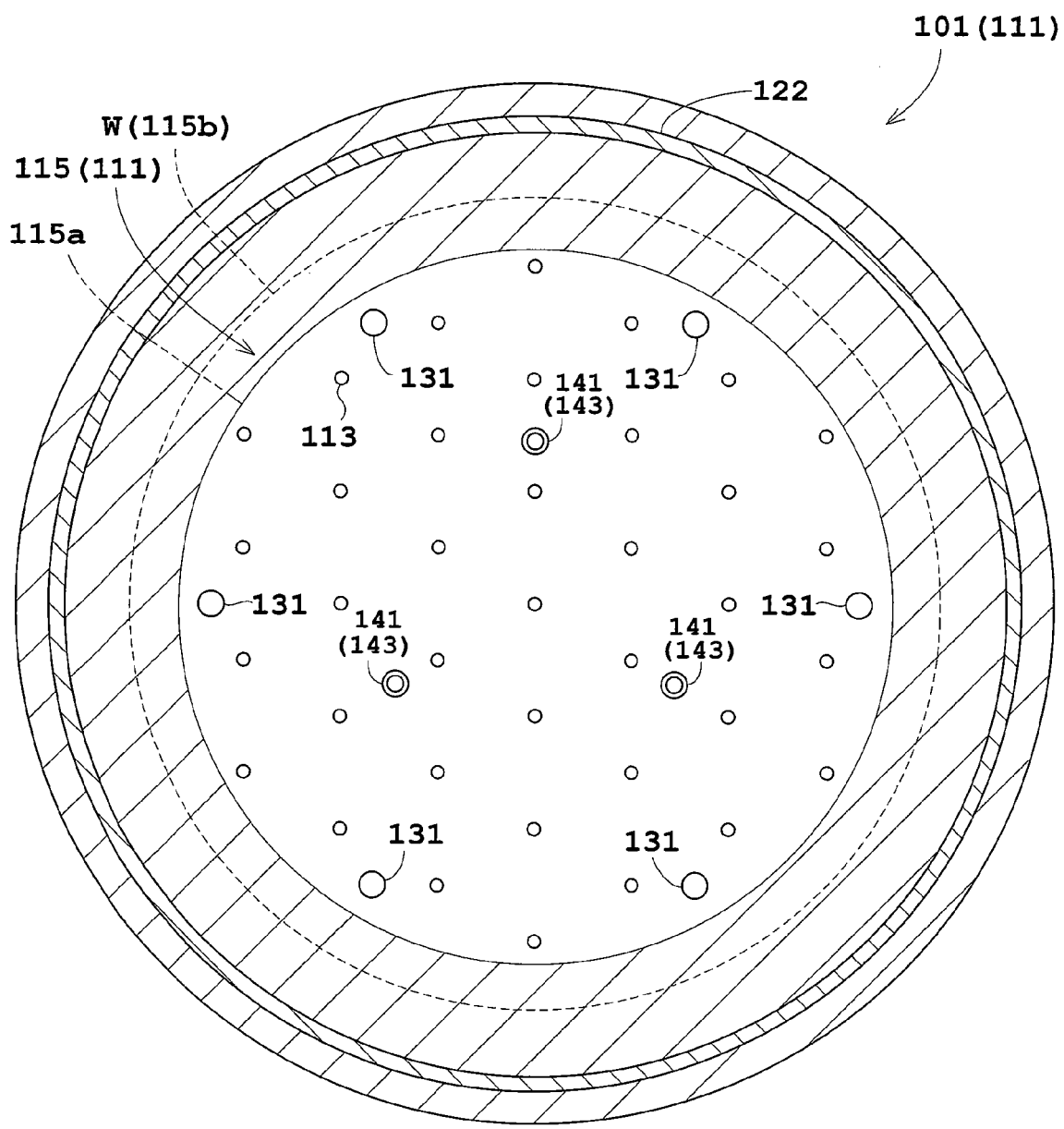
FIG. 13 is a plan view of a heat-treating plate in Embodiment 4.

FIG. 13 is a plan view of a heat-treating plate in Embodiment 4. Parts identical to those of Embodiment 2 are shown with the same reference numerals, and will not be described again.

The heat treatment apparatus in Embodiment 4 is characterized by a weight 122. That is, the support sheet 111 in Embodiment 4 has the projections 113 and sealer 115, but does not include the third openings A3 or fourth openings A4 described in Embodiment 2.

The weight 122 has an inside diameter larger than the outside diameter of wafer W, and does not have the function to position the wafer W horizontally, as do the guides 121 described in Embodiment 2. The weight 122 is placed on the support sheet 111 to press the support sheet 111 down on the heat-treating plate 101 while permitting expansion and contraction of the support sheet 111. Preferably, the weight 122 is lightweight to the extent of permitting expansion and contraction of the support sheet 111. When a predetermined heat treatment is carried out by the heat treatment apparatus having this construction, the support sheet 111 expands and contracts with the weight 122 mounted thereon.

Thus, the heat treatment apparatus in Embodiment 4 also permits expansion and contraction of the support sheet 111. When the support sheet 111 expands or contracts relative to the heat-treating plate 101, no creases or bending are produced on the support sheet 111.

Further, the weight 122, which is ring-shaped, can prevent ambient air from flowing in between the support sheet 111 and heat-treating plate 101 throughout the circumference thereof. This precludes the inconvenience of the gas having entered between the support sheet 111 and heat-treating plate 101 expanding and contracting to produce creases, bending and the like of the support sheet 111.

Embodiment 5

Embodiment 5 of this invention will be described with reference to FIG. 14.

Figure 14:
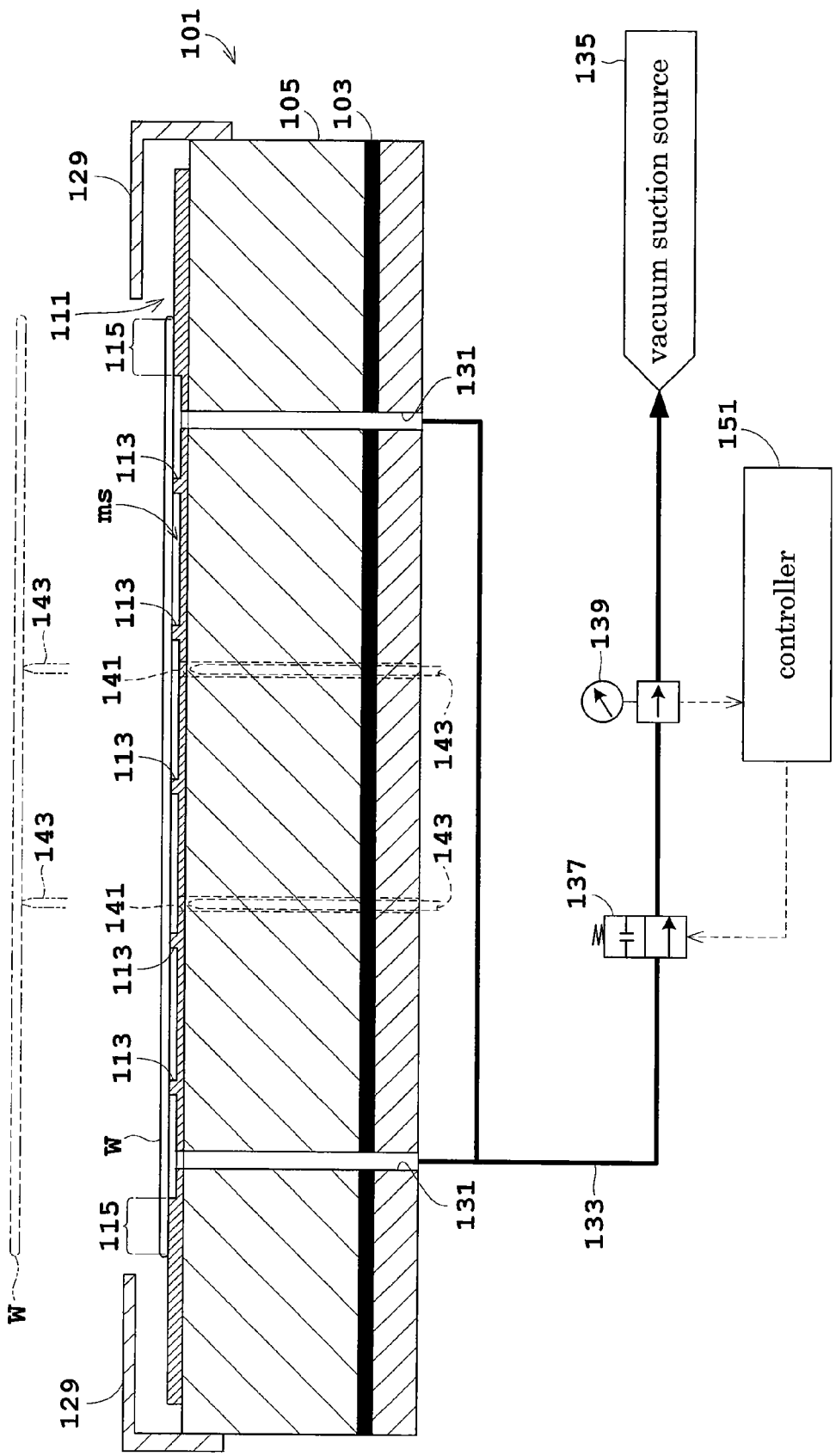
FIG. 14 is a view in vertical section showing an outline of a heat treatment apparatus in Embodiment 5.

FIG. 14 is a view in vertical section showing an outline of a heat treatment apparatus in Embodiment 5. Parts identical to those of Embodiment 2 are shown with the same reference numerals, and will not be described again.

The heat treatment apparatus in Embodiment 5 is characterized by a lift restrictor 129. That is, the support sheet 111 in Embodiment 5 has the projections 113 and sealer 115, but does not include the third openings A3 or fourth openings A4 described in Embodiment 2.

The lift restrictor 129 is L-shaped in front view. One end of the lift restrictor 129 is secured laterally of the heat-treating plate 101, while the other end bent into L-shape covers areas above the portion of the support sheet 111 outward of the sealer 115.

Thus, the heat treatment apparatus in Embodiment 5, with nothing to obstruct expansion and contraction of the support sheet 111, can prevent creases, bending and so on occurring with the support sheet 111. The lift restrictor 129 can effectively restrict lifting of the support sheet 111.

This invention is not limited to the foregoing embodiments, but may be modified as follows:

(1) Embodiment 5 provides the lift restrictor 129, but this is not limitative. That is, the lift restrictor 129 may be omitted from the heat-treating plate 101. In this case also, it is possible to secure the advantage of preventing creases, bending and so on occurring with the support sheet 111 since there is nothing that would obstruct expansion and contraction of the support sheet 111.

(2) In Embodiment 2, the guides 121 are placed on the upper surface of the heat-treating plate 101. These guides 121 may be fixed to the heat-treating plate 101.

(3) The shape of the guides 121 illustrated in Embodiments 2 and 3 may be changed as appropriate.

(4) In Embodiment 2, the guides 121 serve as insert elements. This is not limitative. Other components may be used as insert elements. Alternatively, a modification may be made to provide those elements which function as insert elements exclusively for positioning the support sheet 111 and preventing movement of the entire support sheet 111 (e.g. fastening elements such as bolts).

Similarly, the guides 121 acting also as weights in Embodiment 3 are not limitative. Appropriate weights other than the guides 121 may be provided.

(5) In Embodiments 2 and 3, the guiding ring 127 acts also as lift restrictor. This is not limitative. A different component or components may be used as lift restrictor. It is possible to provide an element that functions solely as lift restrictor for restricting lifting of the support sheet 111.

(6) In Embodiments 2 through 5 described above, each projection 113 has a diameter enlarging from top to bottom. This shape is not limitative. The arrangement of the projections 113 may also be varied as appropriate. The projections 113, which support the wafer W through point contact, may be changed into ridge-like projections for supporting the wafer W through line contact.

Embodiment 6

Embodiment 6 of this invention will be described hereinafter with reference to the drawings.

Figure 15:
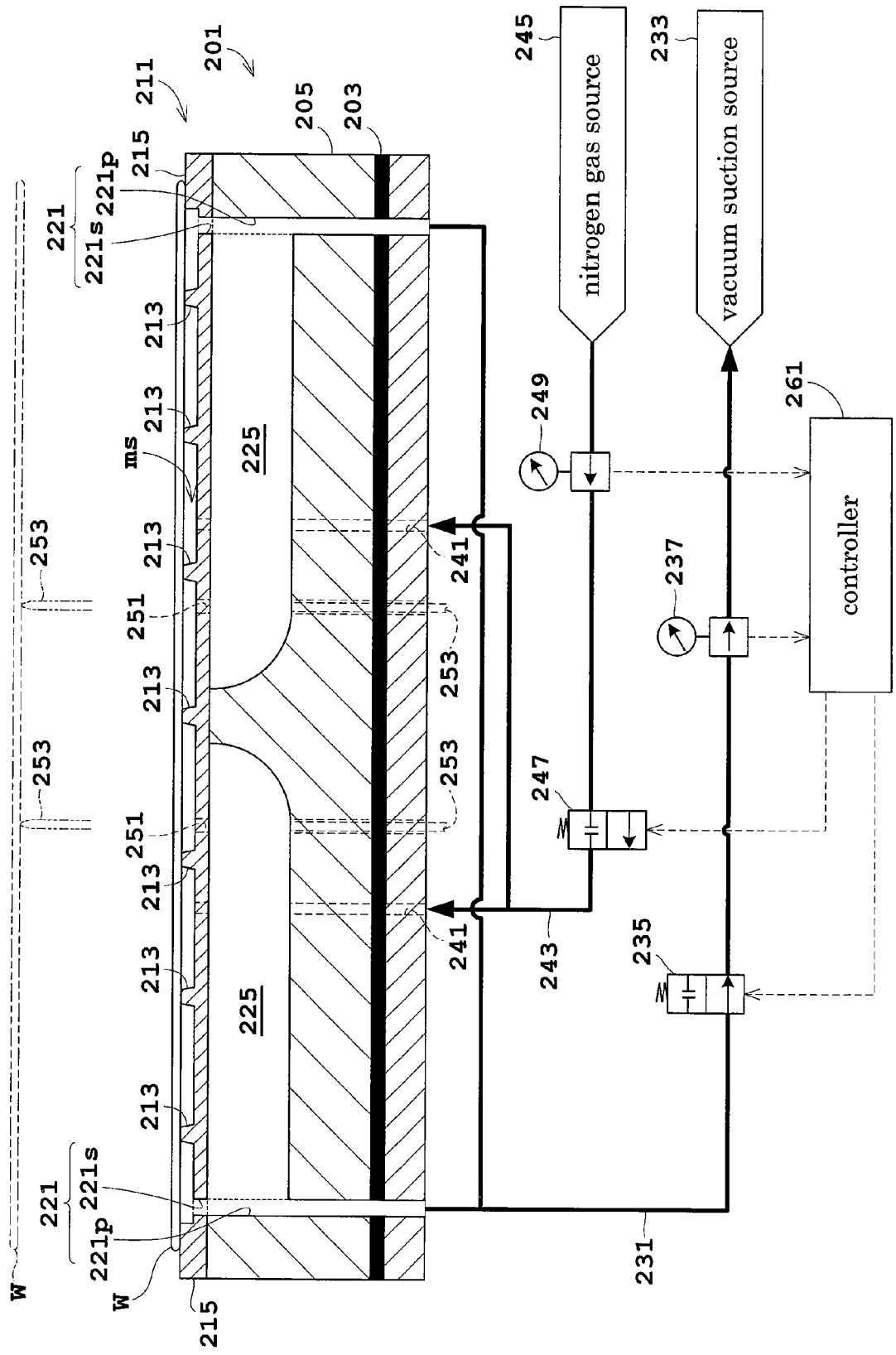
FIG. 15 is a view in vertical section showing an outline of a heat treatment apparatus in Embodiment 6.
Figure 16:
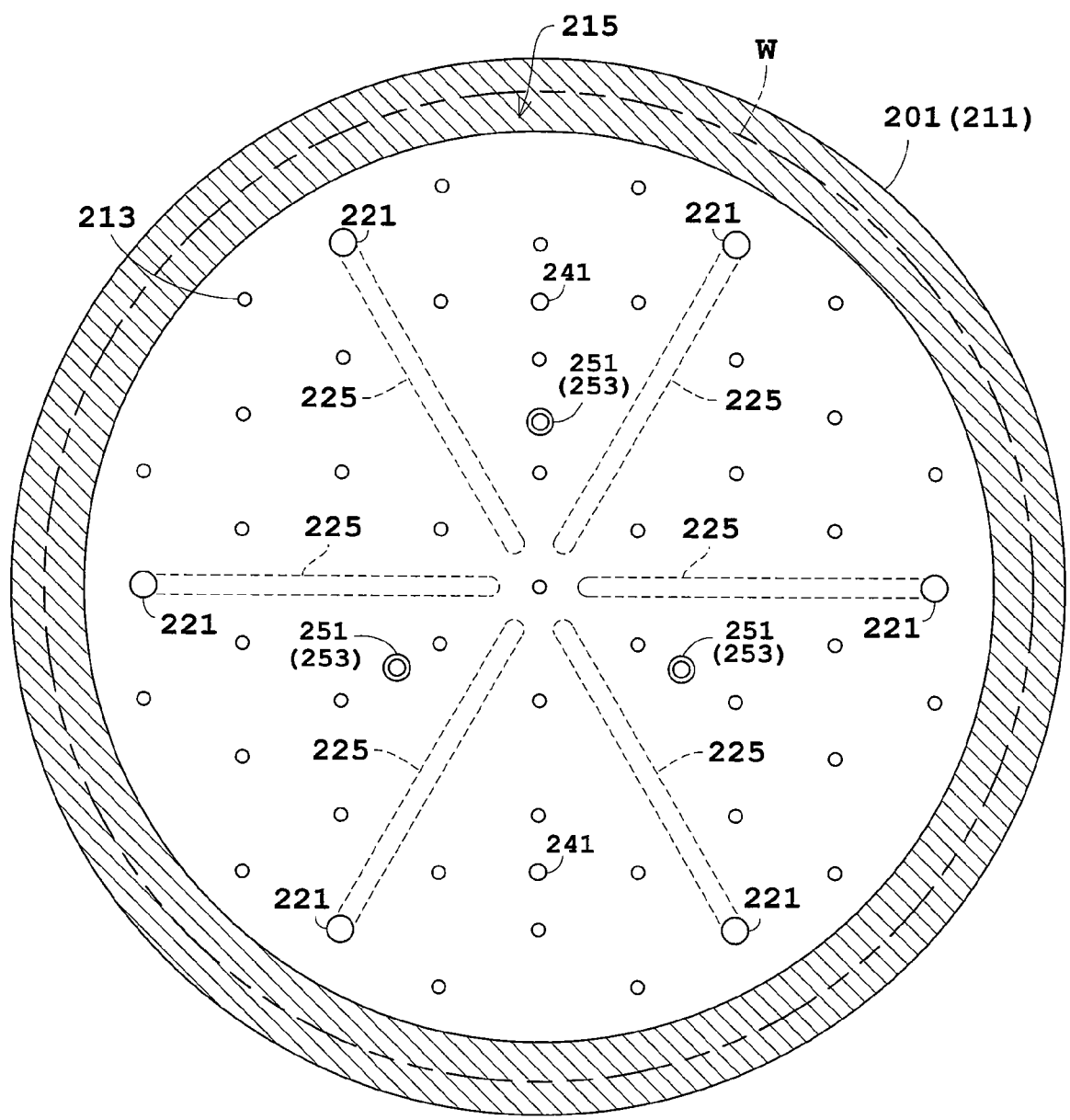
FIG. 16 is a plan view of a heat-treating plate.

FIG. 15 is a view in vertical section showing an outline of a heat treatment apparatus in Embodiment 6. FIG. 16 is a plan view of a heat-treating plate.

A heat-treating plate 201 is circular and has a slightly larger diameter than a wafer W in plan view. The upper surface of the plate 201 is flat. The heat-treating plate 201 is formed of a metal such as copper or aluminum having high thermal conductivity, for example. The heat-treating plate 201 has a heating element 203 such as a mica heater mounted therein. A heat transfer portion 205 between the heating element 203 and the upper surface of heat-treating plate 201 has a plurality of heat pipes, not shown, embedded therein. Cooling grooves, not shown, are formed between the heat pipes for circulating a cooling fluid.

A support sheet 211 is laid on the upper surface of the heat-treating plate 201. The support sheet 211 has projections 213 formed thereon for contacting and supporting a wafer W. The support sheet 211 is placed in a predetermined position on the heat-treating plate 201 without being fixed thereto. The support sheet 211 has a sealer 215 formed thereon for contacting edge regions of the wafer W. The support sheet 211 corresponds to the second sheet-like object in this invention.

The plurality of (e.g. 43) projections 213 are arranged regularly. Each projection 213 is pillar-shaped, with a diameter slightly enlarging from an upper end that contacts the wafer W to a lower end. The height of projections 213 is 75 µm, for example.

The sealer 215 is ring-shaped in plan view, with a diameter slightly smaller than the outside diameter of the wafer W. The sealer 215 has the same height as the projections 213. Thus, the sealer 215 closes lateral areas of a space (hereinafter called minute space "ms") formed between the wafer W and the support sheet 211. The sealer 215 corresponds to the closing device in this invention. The minute space "ms" corresponds to the "space formed between the substrate and the second sheet-like object" or "first space" in this invention.

The support sheet 211 is formed by etching a heat-resistant resin. It is preferred that the resin is resistant to chemicals also. Specifically, such a material may, for example, be polyimide, polytetrafluoroethylene (PTFE), polychlorotrifluoroethylene (PCTFE), polyetheretherketone (PEEK), polyphenylene sulphide (PPS), polyvinylidene fluoride (PVDF), polyethersulfone (PES), polysulfone (PSF), polyetherimide (PEI), or a heat-resistant rubber material. However, the method of manufacturing the support sheet 211 is not limited to the above. For example, the projections 213 and sealer 215 may be formed by welding to a resin film or sheet, respectively. The support sheet 211 may be formed integral.

The heat treatment apparatus in this embodiment has second exhaust bores 221, supply bores 241 and through-holes 251 extending through the heat-treating plate 201 and support sheet 211. These bores and holes will be described in order.

The second exhaust bores 221 are formed for exhausting gas from the minute space "ms". The number of second exhaust bores 221 is six, and these bores 221 are arranged adjacent the edge of the heat-treating plate 201 in plan view. Each second exhaust bore 221 is divided into a plate bore 221p formed in the heat-treating plate 201, and a sheet bore 221s formed in the support sheet 211 and communicating with the plate bore 221p.

The heat-treating plate 201 has grooves 225 formed in the upper surface thereof and communicating with the second exhaust bores 221, respectively. The grooves 225 extend linearly from adjacent the edge to the center of the heat-treating plate 201. The grooves 225 are formed for the respective second exhaust bores 221 and independently of one another. Each groove 225 has a height from its bottom to the upper surface of the heat-treating plate 201 (that is, depth of each groove 225), which is greater than the height of the projections 213 to be described hereinafter. Each groove 225 is, for example, 0.5 mm deep and 1 mm wide. Since upper parts of the grooves 225 are covered by the support sheet 211, the plate bores 221p function also as suction bores for sucking the support sheet 211. The second exhaust bores 221 including the plate bores 221p act also as suction bores. The grooves 225 correspond to the grooves or second space in this invention.

One end of exhaust piping 231 is connected commonly to the second exhaust bores 221 at the lower surface of the heat-treating plate 201. A vacuum suction source 233 is connected to the other end of the exhaust piping 231. This vacuum suction source 233 is a vacuum utility provided for a cleanroom, for example. The exhaust piping 231 has a switch valve 235 for regulating pressure (negative pressure), and a pressure gauge 237 for measuring the pressure. The exhaust piping 231 and vacuum suction source 233 function as an exhaust device.

The supply bores 241 are formed for supplying a gas into the minute space "ms". The number of supply bores 241 is two, and each supply bore 241 is formed in a position spaced from the grooves 225. One end of supply piping 243 is connected commonly to the supply bores 241 at the lower surface of the heat-treating plate 201. A nitrogen gas source 245 is connected to the other end of the supply piping 243. This nitrogen gas source 245 is a utility provided for the cleanroom, for example. The supply piping 243 has a switch valve 247 and a pressure gauge 249. The nitrogen gas source 245 may be replaced with a clean air source. The supply piping 243 and nitrogen gas source 245 function as a supply device.

The through-holes 251 are formed for receiving lift pins 253. Three through-holes 251 are formed in positions corresponding to the apexes of an equilateral triangle centering on the center of heat-treating plate 201 in plan view. The lift pins 253 inserted in the through-holes 251, respectively, have lower ends thereof connected to a lift mechanism not shown. Thus, the lift pins 253 are vertically movable to transfer the wafer W to and from a transport device not shown.

A controller 261 performs an overall control of the apparatus, i.e. controls output of the heating element 203 noted hereinbefore, switching operation of the switch valve 235 and switch valve 247, and driving of the lift mechanism. These controls are performed based on a recipe stored beforehand. The switching operation of the switch valve 235 and switch valve 247 is based on results of detection by the pressure gauge 237 and pressure gauge 249, respectively. The controller 261 is realized by a central processing unit (CPU) which performs various processes, a RAM (Random Access Memory) used as the workspace for operation processes, and a storage medium such as a fixed disk for storing a variety of information.

Figure 17:
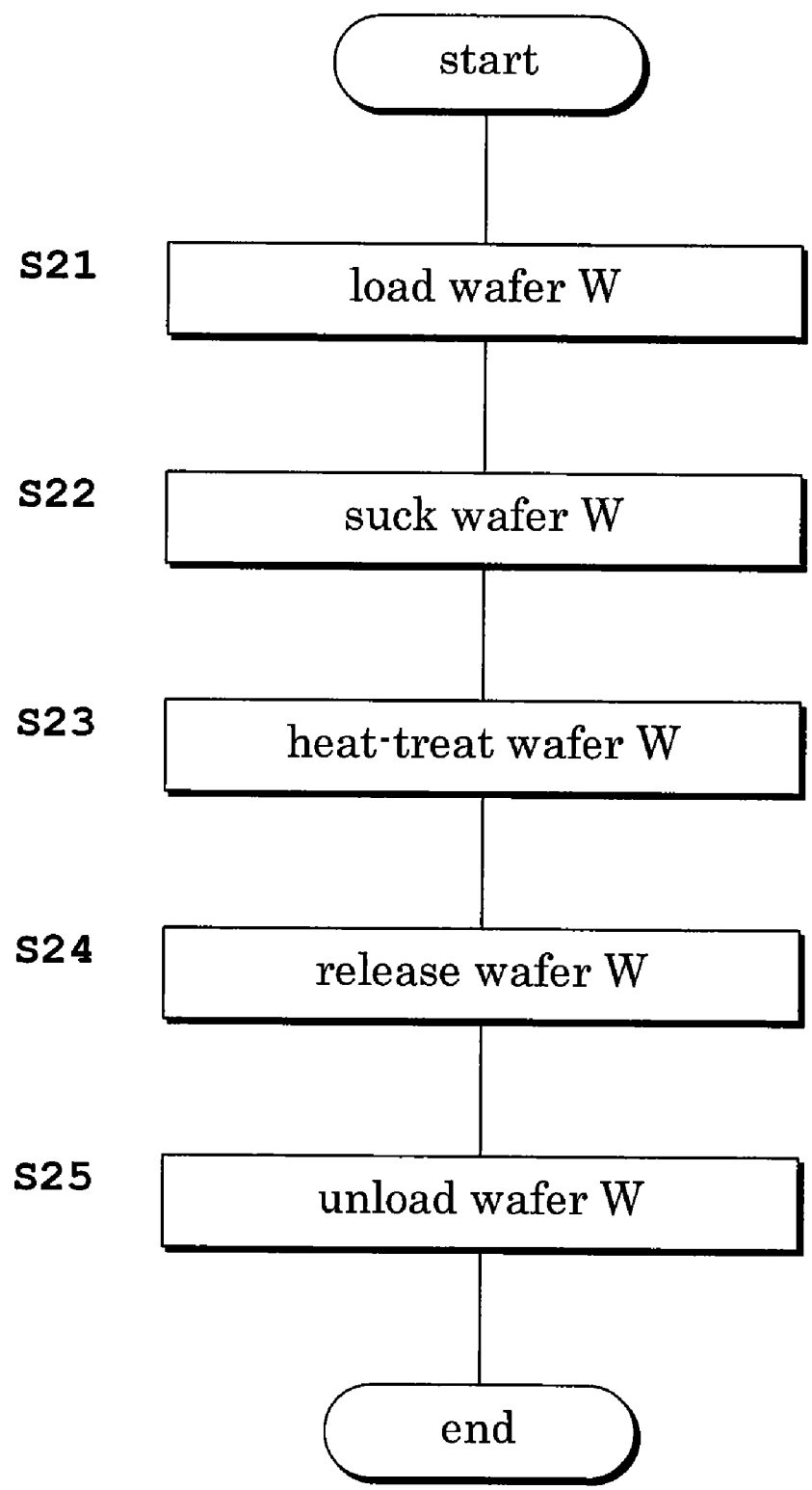
FIG. 17 is a flow chart showing a procedure of treatment by the heat treatment apparatus.

Operation of the heat treatment apparatus in Embodiment 6 will be described next. FIG. 17 is a flow chart showing a procedure of treatment by the heat treatment apparatus. Temperature control of the heating element 203, for example, is assumed to have already been carried out according to the recipe, and will be omitted from the following description.

<Step S21> Load Wafer W

The controller 261 drives the lift mechanism to raise the lift pins 253 and receive a wafer W from the transport device not shown. Then, the wafer W is placed on the support sheet 211. The wafer W is contacted and supported by the projections 213 and sealer 215. The closed minute space "ms" is formed between the wafer W and support sheet 211.

<Step S22> Suck Wafer W

The controller 261, while referring to results of measurement by the pressure gauge 237, opens the switch valve 235 to control the pressure in the minute space "ms" to a predetermined treating pressure Pms (negative pressure). Consequently, the gas in the minute space "ms" is exhausted through the second exhaust bores 221, and the gas in the grooves 225 also is exhausted through the plate bores 221p.

Figure 18:
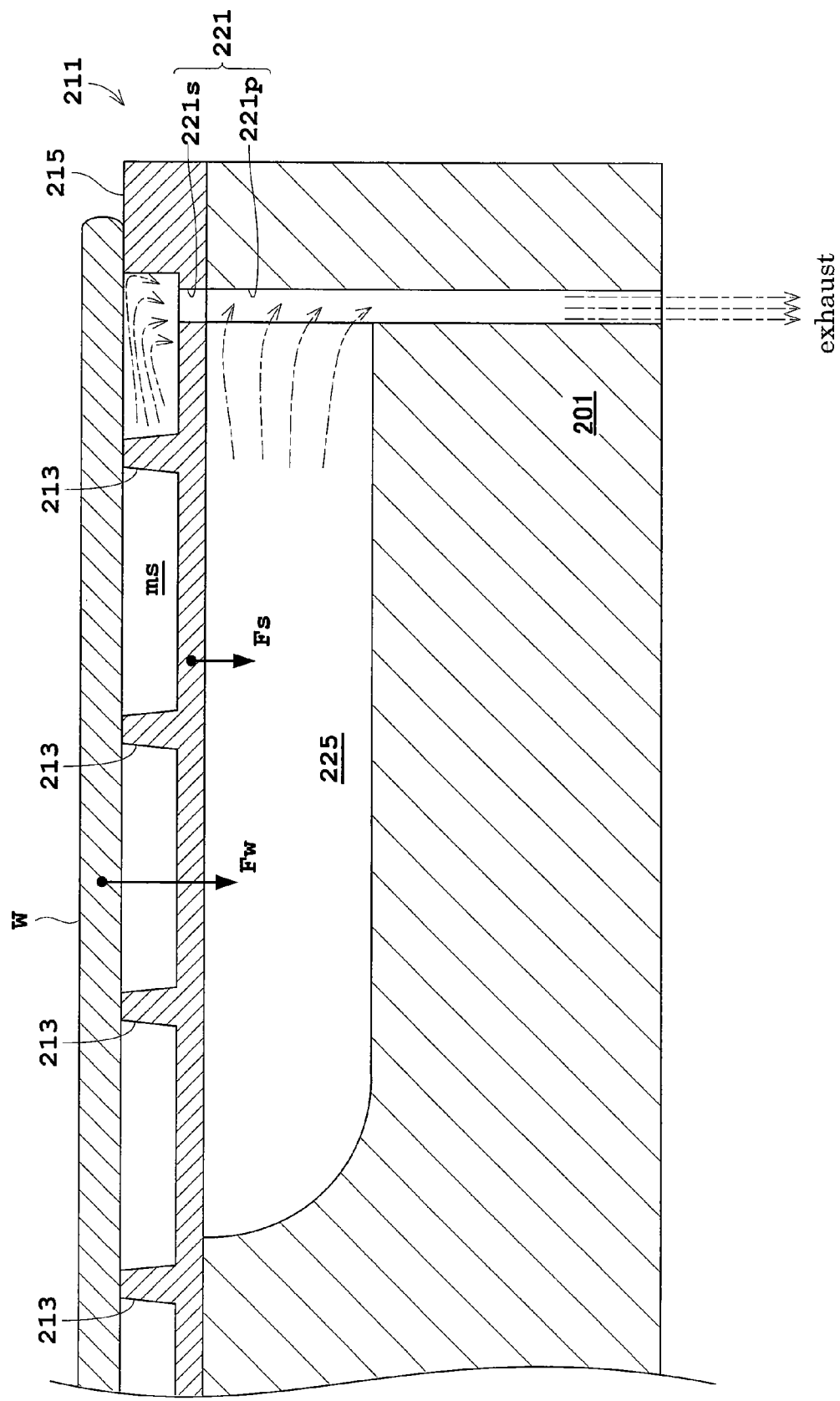
FIG. 18 is a view schematically showing gas currents occurring in a minute space and grooves when a substrate is sucked.

FIG. 18 is a view schematically showing gas currents occurring in the minute space "ms" and grooves 225 when the wafer W is sucked. After the gas begins to be exhausted and until the treating pressure Pms is reached, the gas in each of the minute space "ms" and grooves 225 flows toward the second exhaust bores 221 (or plate bores 221p) as shown in alternate long and short dash lines in FIG. 18. To compare the channels of the gas currents, the depth of the grooves 225 is considerably larger than the height of the minute space "ms", and the grooves 225 have a larger passage cross-sectional area than the minute space "ms". Consequently, the grooves 225 offer a lower resistance to the gas currents than the minute space "ms".

Figure 19:
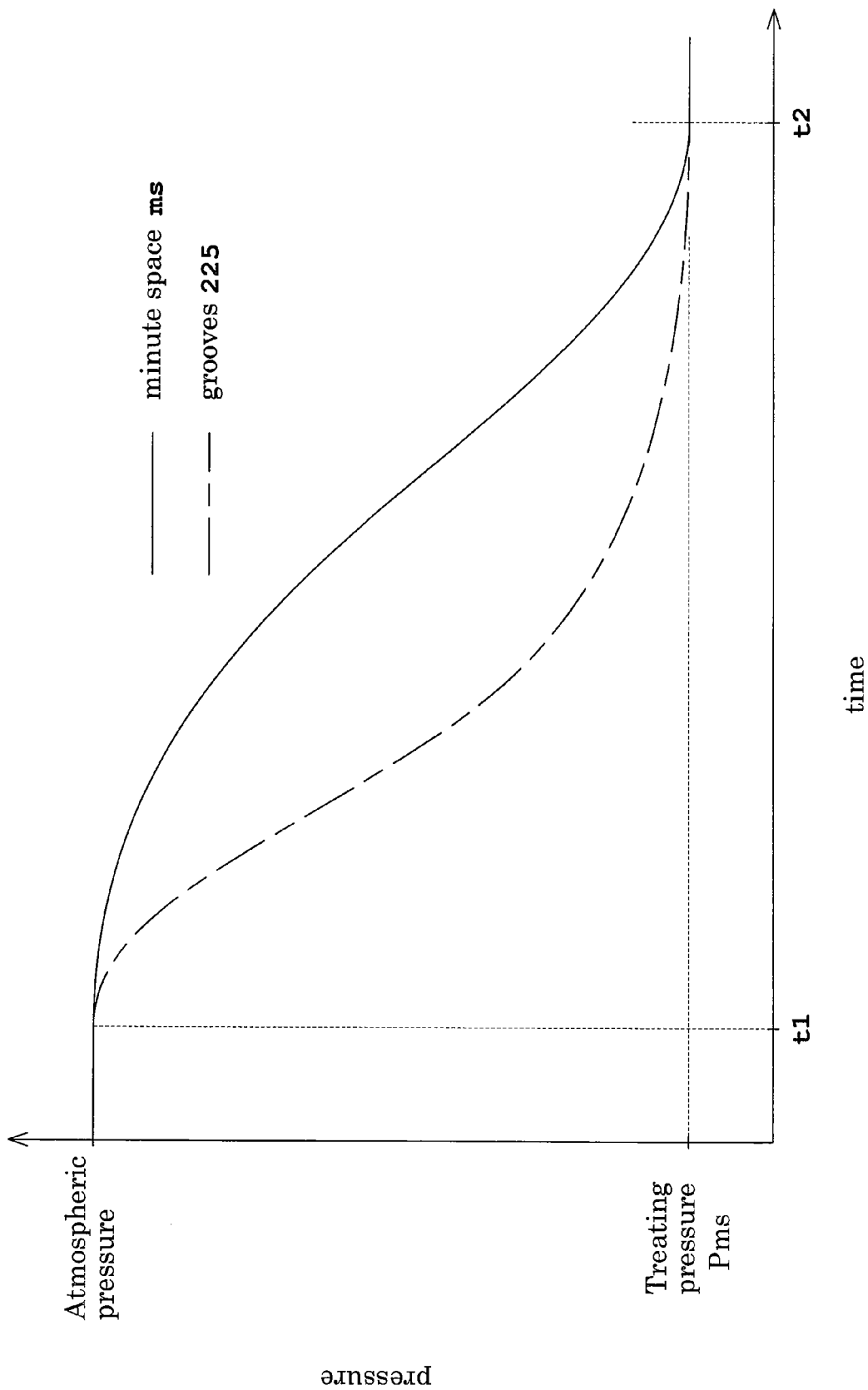
FIG. 19 is a graph showing pressure variations occurring in the minute space and grooves when the pressure in the minute space is changed to a treating pressure.

Thus, when sucking the wafer W, the pressures in the minute space "ms" and grooves 225 fall as shown in FIG. 19. FIG. 19 is a graph showing pressure variations occurring in the minute space "ms" and grooves 225 when the pressure in the minute space "ms" is changed to the treating pressure. In FIG. 19, t1 indicates a time when the gas begins to be exhausted, and t2 indicates a time when the pressure in the minute space "ms" stabilizes at the treating pressure Pms. It is assumed that, up to time t1, both the minute space "ms" and grooves 225 are at atmospheric pressure. It will be seen that, after time t1, the pressure falls in the grooves 225 before it does in the minute space "ms". From time t1 to time t2, the pressure in the grooves 225 is constantly maintained the same as or lower than the pressure in the minute space "ms".

Thus, when sucking the wafer W (time t1 to time t2), as shown in FIG. 18, a force Fs acts on the support sheet 211 only in the direction of the heat-treating plate 201 as a result of a transitional pressure difference between the grooves 225 and minute space "ms". In other words, no force acts on the support sheet 211 in the direction of the wafer W. The wafer W is subjected a force Fw acting in the direction of the support sheet 211 according to the pressure in the minute space "ms", whereby the wafer W is sucked.

<Step S23> Heat-Treat Wafer W

A predetermined heat treatment is carried out for the wafer W while maintaining the wafer W in the above state for a predetermined time.

<Step S24> Release Wafer W

Upon completion of the predetermined heat treatment, the controller 261 closes the switch valve 235 and opens the switch valve 247. Nitrogen gas is supplied to the minute space "ms" through the supply bores 241. At this time, the nitrogen gas flows into the grooves 225 from the minute space "ms", and therefore the pressure will never become higher in the grooves 225 than in the minute space "ms". As a result, the wafer W is released from the suction.

<Step S25> Unload Wafer W

After the wafer W is released from suction, the controller 261 drives the lift mechanism to cause the lift pins 253 to push up the wafer W and transfer the wafer W to the transport device not shown.

According to the heat treatment apparatus in Embodiment 6, as described above, the grooves 225 are formed in the upper surface of the heat-treating plate 201 to communicate with the second exhaust bores 221. When the gas in the minute space "ms" is exhausted through the second exhaust bores 221, the gas in the grooves 225 is exhausted through the plate bores 221p. As a result, the grooves 225 serve to suck the support sheet 211, thereby to bring the support sheet 211 into tight contact with the heat-treating plate 201. That is, the wafer W can be sucked while inhibiting movement of the support sheet 211 relative to the heat-treating plate 201, such as lifting of the support sheet 211 from the heat-treating plate 201, or the support sheet 211 becoming creased.

With the depth of the grooves 225 larger than the height of the projections 213, the pressure in the grooves 225 is made lower than the pressure in the minute space "ms" when sucking the wafer W. This pressure difference results in the force Fs acting on the support sheet 211 in the direction of the heat-treating plate 201. Consequently, the support sheet 211 is reliably prevented from moving relative to the heat-treating plate 201, such as lifting from the heat-treating plate 201.

The grooves 225 are formed to communicate with the second exhaust bores 221, so that the second exhaust bores 221 may serve as suction bores. Thus, additional suction bores need not be formed in the heat-treating plate 201. With the grooves 225 formed to extend between the center and edge of the heat-treating plate 201, the entire support sheet 211 may be attracted uniformly. Further, the grooves 225 formed linear can have a reduced length.

Even when ambient air flows in from areas laterally of the minute space "ms", e.g. from positions of contact between the wafer W and sealer 215, the second exhaust bores 221 formed in the edge regions of the heat-treating plate 201 can immediately exhaust such ambient air. Thus, ambient air is prevented from flowing toward the center of the minute space "ms" to reduce its influence.

Embodiment 7

Embodiment 7 of this invention will be described with reference to FIG. 20.

Figure 20:
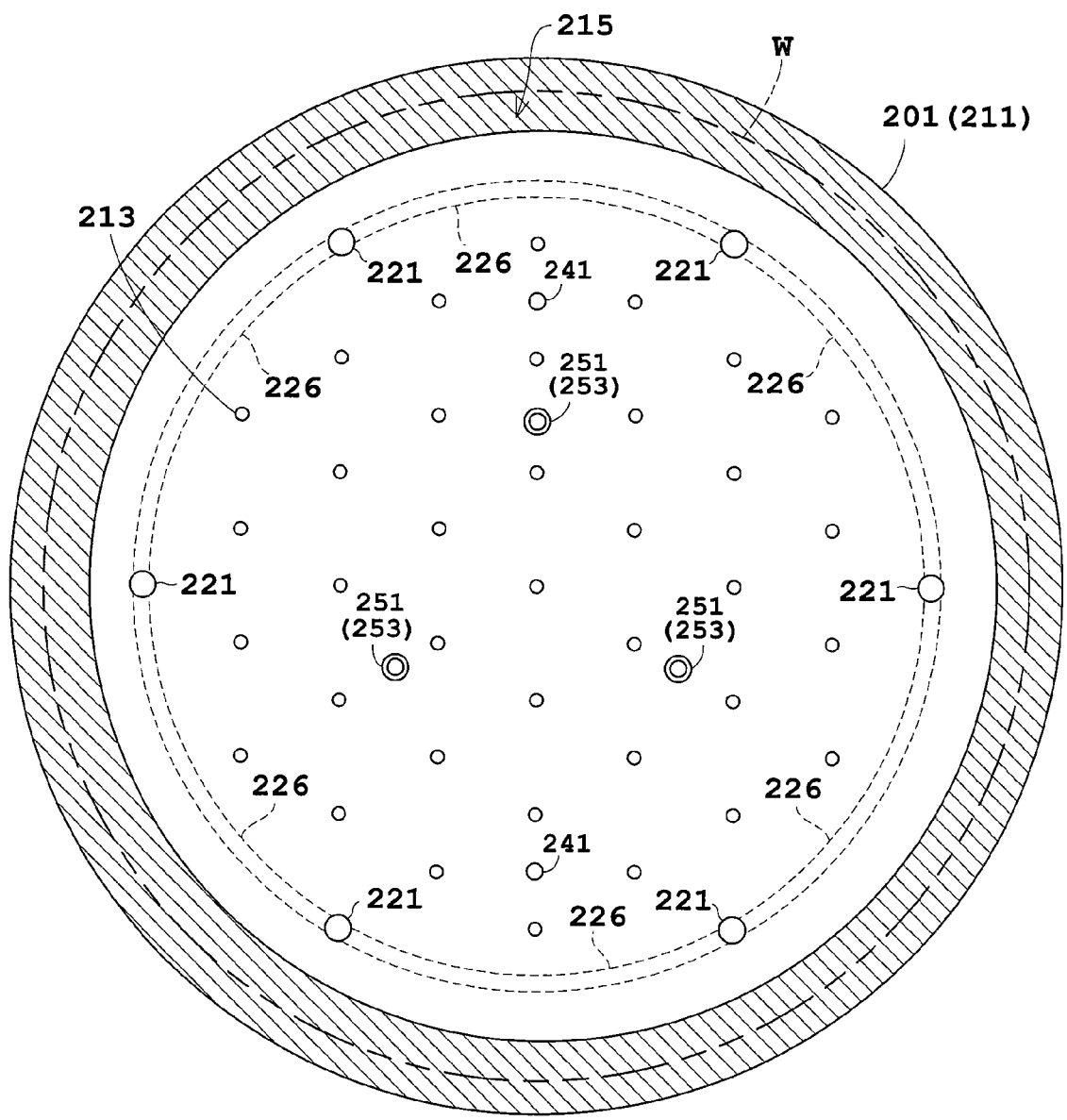
FIG. 20 is a plan view of a heat-treating plate in Embodiment 7.

FIG. 20 is a plan view of a heat-treating plate of a heat treatment apparatus in Embodiment 7. An outline of the apparatus in Embodiment 7 is not shown since it is similar to that in Embodiment 6. In the plan view of FIG. 20, parts identical to those of Embodiment 2 are shown with the same reference numerals, and will not be described again.

The heat treatment apparatus in Embodiment 7 relates to an improvement in the position of groove 226. That is, the groove 226 is in the form of a ring (circle) formed adjacent the edge of the heat-treating plate 201. Thus, all the second exhaust bores 221 are commonly in communication with the single groove 226. The groove 226 corresponds to the groove or second space in this invention.

When sucking the wafer W, the gas in the groove 226 is exhausted through the plate bores 221p constituting the second exhaust bores 221. The support sheet 211 is drawn toward the groove 226, so that the entire perimeter of the support sheet 211 is stretched outward.

Thus, according to the heat treatment apparatus in Embodiment 7, the ring-like groove 226 formed adjacent the edge of the heat-treating plate 201 can inhibit bending and creasing of the support sheet 211.

Embodiment 8

Embodiment 8 of this invention will be described with reference to FIG. 21.

Figure 21:
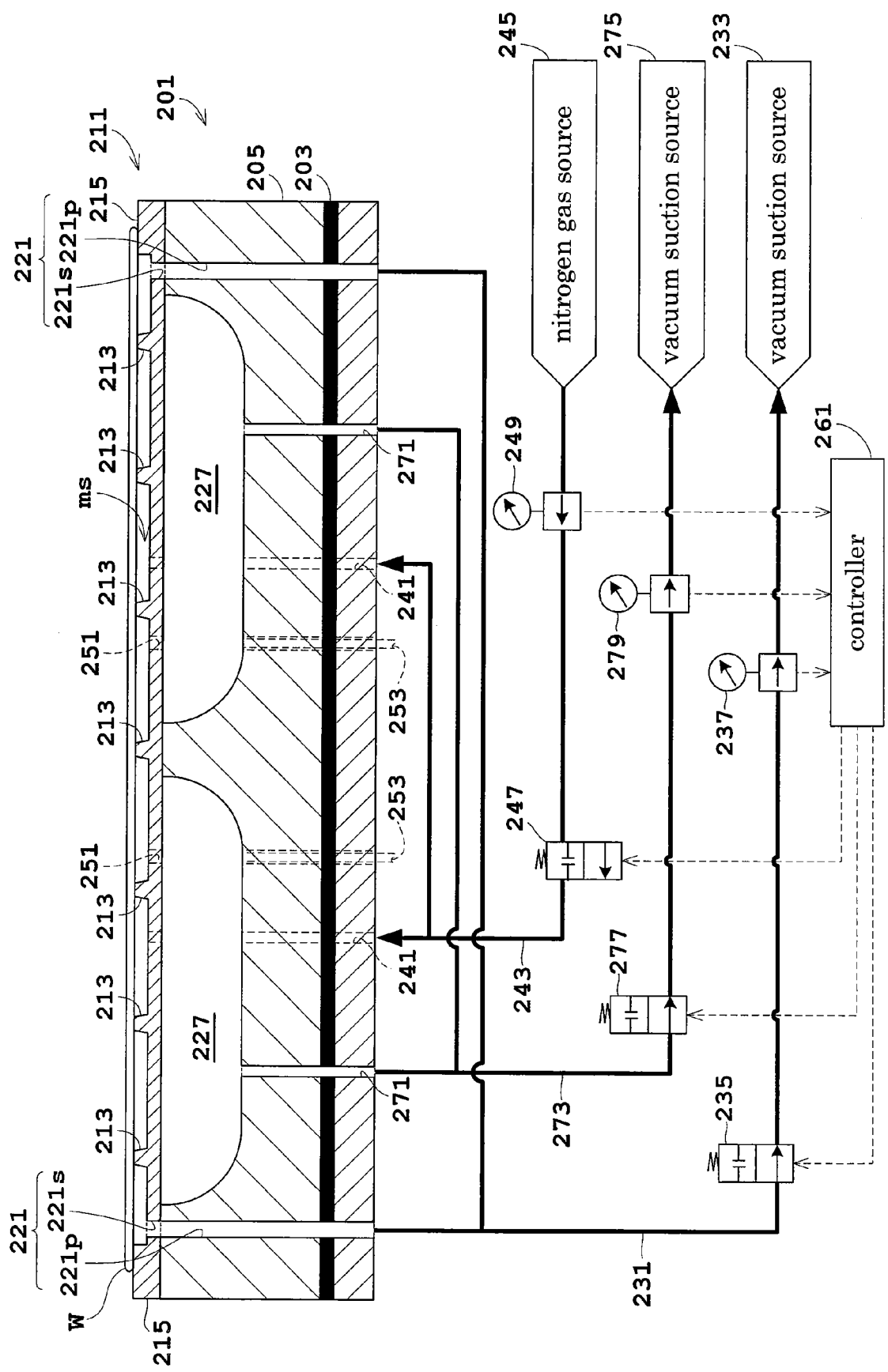
FIG. 21 is a view in vertical section showing an outline of a heat treatment apparatus in Embodiment 8.

FIG. 21 is a view in vertical section showing an outline of a heat treatment apparatus in Embodiment 8. Parts identical to those of Embodiment 6 are shown with the same reference numerals, and will not be described again.

The heat treatment apparatus in Embodiment 8 includes a plurality of suction bores 271 exclusively for sucking the support sheet 211. The heat-treating plate 201 has grooves 227 formed in the upper surface thereof and communicating with the suction bores 271, respectively. However, the grooves 227 are not in communication with the second exhaust bores 221. The grooves 227 correspond to the grooves or second space in this invention.

One end of exhaust piping 273 is connected commonly to the suction bores 271 at the lower surface of the heat-treating plate 201. A vacuum suction source 275 is connected to the other end of the exhaust piping 273. The exhaust piping 273 has a switch valve 277 for regulating pressure (negative pressure), and a pressure gauge 279 for measuring the pressure. The exhaust piping 273 and vacuum suction source 275 function as an exhaust device.

When sucking the wafer W, the controller 261, while referring to results of measurement by the pressure gauge 279, first opens the switch valve 277 to control the pressure in the grooves 227 to a predetermined suction pressure Pd (negative pressure). Preferably, the suction pressure Pd is lower than the treating pressure Pms in the minute space "ms" controlled when sucking the wafer W. The gas in the grooves 227 is exhausted through the suction bores 271, whereby the support sheet 211 is drawn toward the grooves 227. This brings the support sheet 211 into tight contact with the heat-treating plate 201.

Next, with the support sheet 211 maintained in the sucked state, the controller 261, while referring to results of measurement by the pressure gauge 237, opens the switch valve 235 to control the pressure in the minute space "ms" to the predetermined treating pressure Pms (negative pressure). Consequently, the gas in the minute space "ms" is exhausted through the second exhaust bores 221, thereby sucking the wafer W Thus, according to the heat treatment apparatus in Embodiment 8, which includes the suction bores 271 exclusively for sucking the support sheet 211, the support sheet 211 can be sucked prior to exhausting the gas from the minute space "ms". This inhibits movement of the support sheet 211 relative to the heat-treating plate 201.

Embodiment 9

Embodiment 9 of this invention will be described with reference to FIG. 22.

Figure 22:
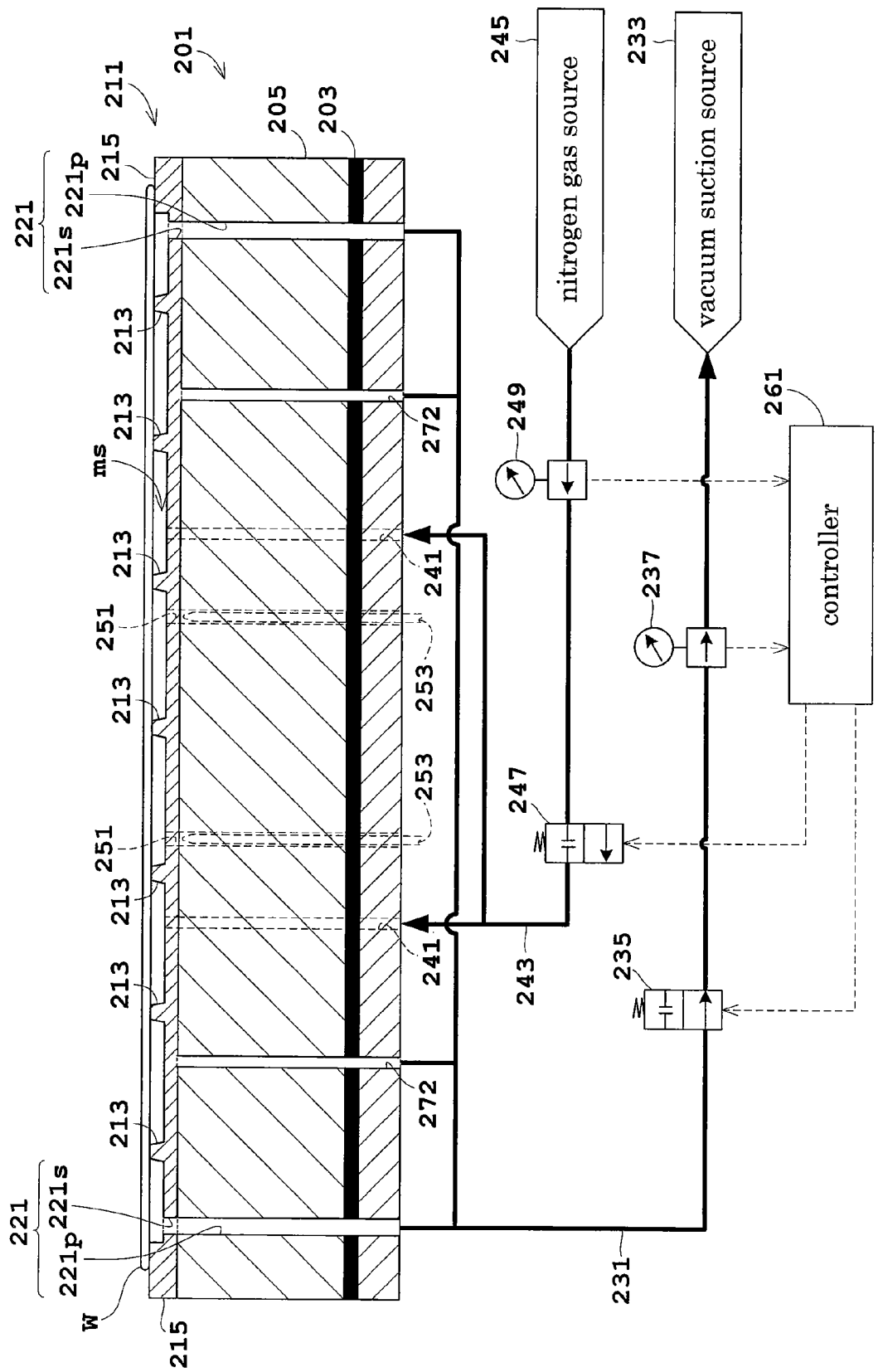
FIG. 22 is a view in vertical section showing an outline of a heat treatment apparatus in Embodiment 9.

FIG. 22 is a view in vertical section showing an outline of a heat treatment apparatus in Embodiment 9. Parts identical to those of Embodiment 6 are shown with the same reference numerals, and will not be described again.

The heat treatment apparatus in Embodiment 9 includes suction bores 272 exclusively for sucking the support sheet 211. The grooves described in Embodiment 6 are not formed in the upper surface of the heat-treating plate 201. The suction bores 272 are connected to the exhaust piping 273 at the lower surface of the heat-treating plate 201.

When sucking the wafer W, the controller 261 operates the switch valve 235 to exhaust gas from the minute space "ms" through the second exhaust bores 221 and exhaust piping 231. The gas in the suction bores 272 also is exhausted through the exhaust piping 231. The support sheet 211 is drawn to openings of the suction bores 272 formed in the upper surface of the heat-treating plate 201.

Thus, the heat treatment apparatus in Embodiment 9, which includes no grooves, can eliminate the influence of particles due to grooves and the influence of grooves on the quality of heat treatment. The construction of the heat-treating plate 201 may also be simplified.

This invention is not limited to the foregoing embodiments, but may be modified as follows:

(1) While Embodiments 6 through 8 described above illustrate different shapes of the grooves 225, 226 and 227, such shapes are not limitative but may be changed as appropriate. For example, a groove may have a spiral shape in plan view, or a plurality of ring-like grooves may be formed.

(2) In Embodiments 6 through 9 described above, the second exhaust bores 221 serve as suction bores for sucking the support sheet 211, or the suction bores 271 and 272 are formed separately from the second exhaust bores 221. Such constructions are not limitative. For example, the heat-treating plate 201 may be formed of a porous material, so that the support sheet 211 may be sucked through the pores contained in the heat-treating plate 201 itself. In this case, the pores contained in the heat-treating plate 201 itself correspond to the suction bores in this invention.

(3) In Embodiment 8 described above, when sucking the wafer W, the support sheet 211 is sucked first and then the gas is exhausted from the minute space "ms". This is not limitative. For example, when controlling the suction pressure Pd in the grooves 227 to be lower than the treating pressure Pms in the minute space "ms", it is possible to start exhausting the gas from the minute space "ms" with the suction of the support sheet 211.

(4) In Embodiments 6 through 9 described above, the second exhaust bores 221 are arranged adjacent the edge of the heat-treating plate 201. This is not limitative. For example, as long as the sheet bores 221s are arranged adjacent the edge, the plate bores 221p communicating with the sheet bores 221s may have their courses altered as appropriate. In this case also, any ambient air flowing in from the areas laterally of the minute space "ms" can be exhausted immediately through the second exhaust bores 221. A modification may be made to arrange the sheet bores 221s adjacent the center of the heat-treating plate 201, for example.

Further, in Embodiments 8 and 9, the second exhaust bores 221 need not serve as suction bores. As long as the gas can be exhausted from the minute space "ms", the construction for exhausting this gas through the second exhaust bores 221 opening to the upper surface of the heat-treating plate 201 may be replaced with exhaust bores extending through the sealer 215, for example. Similarly, the supply bores 241, as long as gas is supplied to the minute space "ms", may be replaced with gas supply bores extending through the sealer 215, for example.

(5) In Embodiments 6 through 9 described above, the projections 213 have a diameter enlarging from top to bottom. The projections 213 are not necessarily limited to this shape. The arrangement of projections 213 may also be varied as appropriate. The projections 213, which support the wafer W through point contact, may be changed into ridge-like projections for supporting the wafer W through line contact.

(6) In Embodiments 6 through 9 described above, the sealer 215 is formed on the support sheet 211. Instead, the sealer may be formed separately from the support sheet 211. The separate sealer may be placed on the support sheet 211, or on the heat-treating plate 201.

(7) In Embodiments 1 through 9 described above, the wafer W is circular. This is not limitative, but rectangular or otherwise shaped substrates may be treated. In this case, the shape of lip 15, sealer 115 or sealer 215 may be changed from circular to an appropriate shape according to the shape of substrates.

(8) In each of Embodiments 1 through 9 described above, heat pipes are embedded in the heat transfer portion 5, 105 or 205. The invention is applicable also to a substrate heat treatment apparatus having no heat pipes.

This invention may be embodied in other specific forms without departing from the spirit or essential attributes thereof and, accordingly, reference should be made to the appended claims, rather than to the foregoing specification, as indicating the scope of the invention.

What is claimed is:
1. A heat treatment apparatus for heat-treating a substrate, comprising:
a heat-treating plate;
a sheet-like object formed of resin and placed on said heat-treating plate, said sheet-like object having, formed on a surface thereof, a ring-like sealer for contacting edge regions of the substrate, and projections for contacting and supporting the substrate inwardly of said sealer; and exhaust bores extending through said heat-treating plate and said sheet-like object for exhausting gas from a space formed between the substrate and said sheet-like object.

2. An apparatus as defined in claim 1, wherein:
said sheet-like object has openings formed outwardly of said sealer;
said apparatus further comprises insert elements arranged in said openings; and
said openings and said insert elements have gaps therebetween for permitting expansion and contraction of said sheet-like object.

3. An apparatus as defined in claim 2, further comprising a lift restrictor disposed above and outwardly of said sealer and spaced from said sheet-like object for restricting lifting of said sheet-like object from said heat-treating plate.

4. An apparatus as defined in claim 3, further comprising:
guide elements for horizontally positioning the substrate; and
a positioning member for contacting and positioning said guide elements;
wherein said guide elements are arranged in said openings to act also as said insert elements, and said positioning member acts also as said lift restrictor.

5. An apparatus as defined in claim 2, further comprising guide elements for horizontally positioning the substrate, said guide elements being arranged in said openings to act also as said insert elements.

6. An apparatus as defined in claim 1, further comprising weights arranged on said sheet-like object outwardly of said sealer for permitting expansion and contraction of said sheet-like object.

7. An apparatus as defined in claim 6, further comprising a lift restrictor disposed above and outwardly of said sealer and spaced from said sheet-like object for restricting lifting of said sheet-like object from said heat-treating plate.

8. An apparatus as defined in claim 7, further comprising:
guide elements for horizontally positioning the substrate; and
a positioning member for contacting and positioning said guide elements;
wherein said guide elements are arranged on said sheet-like object outwardly of said sealer to act also as said weights, and said positioning member acts also as said lift restrictor.

9. An apparatus as defined in claim 6, further comprising guide elements for horizontally positioning the substrate, said guide elements being arranged on said sheet-like object outwardly of said sealer to act also as said weights.

10. An apparatus as defined in claim 1, further comprising a lift restrictor disposed above and outwardly of said sealer and spaced from said sheet-like object for restricting lifting of said sheet-like object from said heat-treating plate.

11. A heat treatment apparatus for heat-treating a substrate, comprising:
a heat-treating plate;
a sheet-like object placed on an upper surface of said heat-treating plate, said sheet-like object having projections formed thereon for contacting and supporting the substrate;
a closing device for closing areas laterally of a space formed between the substrate and said sheet-like object;
exhaust bores for exhausting gas from said space; and
suction bores formed in said heat-treating plate for sucking said sheet-like object;
wherein said exhaust bores include plate bores formed in said heat-treating plate, and sheet bores formed in said sheet-like object to communicate with said plate bores, said sheet bores being arranged adjacent to edge regions of said heat-treating plate.

12. An apparatus as defined in claim 11, further comprising grooves formed in the upper surface of said heat-treating plate to communicate with said suction bores.

13. An apparatus as defined in claim 12, wherein said grooves have a height from bottoms thereof to the upper surface of said heat-treating plate, which is larger than a height of said projections.

14. An apparatus as defined in claim 12, wherein said grooves extend between edge regions and a center of said heat-treating plate.

15. An apparatus as defined in claim 11, further comprising grooves formed in the upper surface of said heat-treating plate to communicate with said exhaust bores, said exhaust bores acting also as said suction bores.

16. An apparatus as defined in claim 15, wherein said grooves have a height from bottoms thereof to the upper surface of said heat-treating plate, which is larger than a height of said projections.

17. An apparatus as defined in claim 15, wherein said grooves extend between edge regions and a center of said heat-treating plate.

18. A substrate sucking method for sucking a substrate contacted and supported by projections formed on a sheet-like object formed of resin and placed on an upper surface of a heat-treating plate, said method comprising:
forming a first space between the substrate and said sheet-like object;
forming a second space between said sheet-like object and said heat-treating plate; and
exhausting gas from said first space to bring the substrate into tight contact with said projections, and exhausting gas from said second space to bring said sheet-like object into tight contact with said heat-treating plate, while maintaining a pressure in said second space below a pressure in said first space.

19. A method as defined in claim 18, wherein, in time of gas exhaustion, a flow resistance to gas flows occurring in said second space is lower than a flow resistance in said first space.

* * * * *